United States Patent
Beidas et al.

(10) Patent No.: US 9,203,450 B2
(45) Date of Patent: Dec. 1, 2015

(54) SYSTEM AND METHOD FOR PRE DISTORTION AND ITERATIVE COMPENSATION FOR NONLINEAR DISTORTION IN SYSTEM EMPLOYING FTN SYMBOL TRANSMISSION RATES

(71) Applicant: Hughes Network Systems, LLC, Germantown, MD (US)

(72) Inventors: Bassel Beidas, Alexandria, VA (US);
Rohit Iyer Seshadri, Gaithersburg, MD (US); Mustafa Eroz, Germantown, MD (US); Lin-Nan Lee, Potomac, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 0 days.

(21) Appl. No.: 14/510,080

(22) Filed: Oct. 8, 2014

(65) Prior Publication Data

US 2015/0098521 A1    Apr. 9, 2015

Related U.S. Application Data

(60) Provisional application No. 61/888,500, filed on Oct. 8, 2013.

(51) Int. Cl.
*H04K 1/02* (2006.01)
*H04L 25/49* (2006.01)
*H04B 1/04* (2006.01)
*H04B 7/185* (2006.01)

(52) U.S. Cl.
CPC .......... *H04B 1/0475* (2013.01); *H04B 7/18517* (2013.01); *H04B 2001/0425* (2013.01)

(58) Field of Classification Search
CPC . A01B 12/006; H04B 1/0475; H04B 7/18513
USPC ........................................................ 375/296
See application file for complete search history.

(56) References Cited

U.S. PATENT DOCUMENTS 4,059,800 A    11/1977 Jones
5,134,464 A    7/1992 Basile et al.
(Continued)

FOREIGN PATENT DOCUMENTS

WO    WO2010049858 A2    5/2010

OTHER PUBLICATIONS

LETI, "Predistortion Techniques", Information Society Technologies, IST-2001-34561/LETI/WP3/R/PU/002, Jul. 30, 2004.
(Continued)

*Primary Examiner* — Qutbuddin Ghulamali
(74) *Attorney, Agent, or Firm* — Potomac Technology Law, LLC

(57) ABSTRACT

A signal transmission approach comprises encoding a source signal (comprising a plurality of source symbols) to generate a corresponding encoded signal. The encoded signal is modulated by mapping each source symbol to a respective signal constellation point of an applied signal constellation to generate a modulated signal. The modulated signal is pre-distorted based on a distortion estimate to generate a pre-distorted signal. The pre-distorted signal is filtered to generate a filtered signal. The filtered signal is frequency translated and amplified to generate a transmission signal for transmission via an uplink channel of a satellite communications system. To increase throughput, the source signal is processed through the apparatus and the resulting transmission signal is generated at a Faster-than-Nyquist (FTN) symbol rate and with a tight frequency roll-off. The modulated signal is pre-distorted based on a distortion estimate relating to the nonlinearity and the filters applied before and/or after the pre-distorter.

20 Claims, 16 Drawing Sheets

(56) References Cited

U.S. PATENT DOCUMENTS

| | | | |
|---|---|---|---|
| 6,690,739 | B1 | 2/2004 | Mui |
| 7,106,813 | B1 | 9/2006 | Ling |
| 8,526,523 | B1 | 9/2013 | Eliaz |
| 8,897,387 | B1 | 11/2014 | Eliaz |
| 8,995,572 | B1* | 3/2015 | Wu .............................. 375/297 |
| 2001/0024474 | A1 | 9/2001 | Rakib et al. |
| 2001/0040926 | A1 | 11/2001 | Hannuksela et al. |
| 2002/0154620 | A1 | 10/2002 | Azenkot et al. |
| 2003/0033574 | A1 | 2/2003 | Vasic et al. |
| 2003/0095610 | A1 | 5/2003 | Liang et al. |
| 2005/0169164 | A1* | 8/2005 | Cannella et al. ............. 370/206 |
| 2008/0049848 | A1* | 2/2008 | Turnbull et al. ............. 375/251 |
| 2010/0183106 | A1* | 7/2010 | Beidas et al. ................ 375/350 |
| 2010/0208788 | A1 | 8/2010 | Azazzi et al. |
| 2011/0188550 | A1 | 8/2011 | Wajcer et al. |
| 2011/0234314 | A1* | 9/2011 | Kumar .......................... 330/149 |
| 2011/0299572 | A1* | 12/2011 | Monsen et al. ............... 375/214 |
| 2012/0027132 | A1 | 2/2012 | Rouquette |
| 2012/0039247 | A1* | 2/2012 | Wajcer et al. ................ 370/316 |
| 2012/0039380 | A1 | 2/2012 | Schmitt et al. |

OTHER PUBLICATIONS

USPTO, "International Search Report & Written Opinion", PCT/US2014/059781, Dec. 17, 2014.

Barbieri, et al., "Improving the Spectral Efficiency of Linear Modulations Through Time-Frequency Packing", ISIT 2008, Toronto, Canada, Jul. 6-11, 2008, IEEE 978-1-4244-2571-6/08, Jul. 6, 2008.

Barbieri, et al., "Time-Frequency Packing for Linear Modulations: Spectral Efficiency and Practical Detection Schemes", IEEE Transactions on Communications, vol. 57, No. 10, Oct. 2009, IEEE 0090-6778/09.

Dasalukunte, "Multicarrier Faster-Than-Nyquist Signaling Transceivers", Lund University, Ph.D Thesis, Jan. 2012.

Hagenauer, "The Turbo Code Principle in Mobile Communications", International Symposium on Information Theory and Its Applications, Xi'an, PRC, Oct. 7-11, 2002.

Modenini, et al., "How to Significantly Improve the Spectral Efficiency of Linear Modulations through Time-Frequency Packing and Advanced Processing", IEEE ICC 2012—Selected Areas in Communications Symposium, IEEE 978-1-4577-2053-6/12, Jun. 2012.

Piemontese, et al., "Improving the Spectral Efficiency of Nonlinear Satellite Systems through Time-Frequency Packing and Advanced Processing", arXiv:1301.4184v1 [cs.IT], Jan. 17, 2013.

Sklar, "A Primer on Turbo Code Concepts", IEEE Communications Magazine, Dec. 1997, IEEE 0163-6804/97, Dec. 1997.

Vidal, et al., "Next Generation High Throughput Satellite System", First International IEEE-AESS Conference in Europe on Space and Satellite Telecommunications, Oct. 2-5, 2012, Rome, Italy.

USPTO, "International Search Report & Written Opinion", PCT App. No. PCT/US2014/045833, Oct. 7, 2014.

* cited by examiner

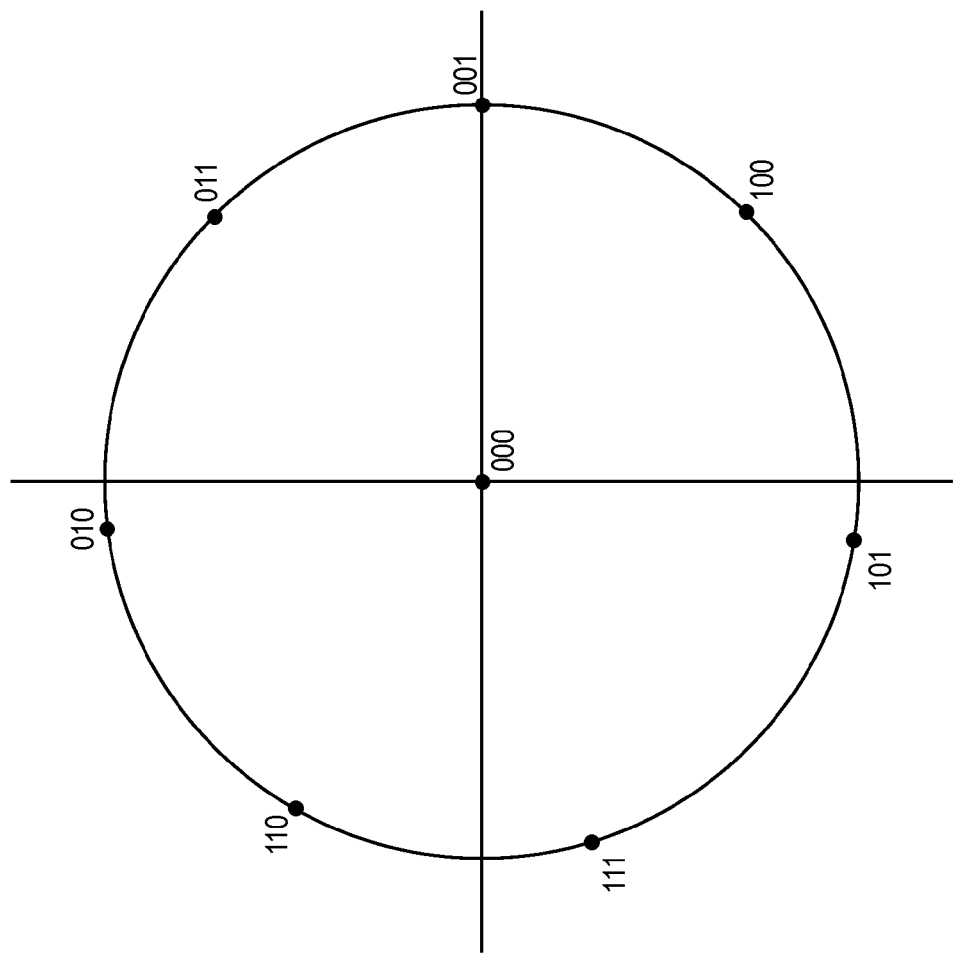

SYSTEM AND METHOD FOR PRE DISTORTION AND ITERATIVE COMPENSATION FOR NONLINEAR DISTORTION IN SYSTEM EMPLOYING FTN SYMBOL TRANSMISSION RATES

RELATED APPLICATIONS

This application claims the benefit of the earlier filing date under 35 U.S.C. §119(e) of U.S. Provisional Application Ser. No. 61/888,500 (filed 2013 Oct. 8).

BACKGROUND

The present invention generally covers receivers in wireless communications systems, and more specifically is generally drawn to addressing noise and/or interference effects exhibited by received signals, where the signals were transmitted via a transmitter employing high power amplifiers (HPAs), such as satellite transponders in a satellite communications system. A satellite communication system may include a transmitter having a high power amplifier (HPA) or a transponder that includes a transmitter having an HPA. The output of a transmitter can be seen as a sequence of symbols called a phrase. Each symbol represents a sequence of bits (e.g., in the case of 8PSK, each symbol represents 3 bits), and the transmitter will output the phrase one symbol at a time during transmission. As a transmitter shifts from one symbol to the next in the phrase, previous output symbols may cause interference in the output of the current symbol. Similarly, the current symbol is also affected by interference resulting from subsequent or future symbols. This interference in the current symbol caused by previous as well as symbols is referred to as the inter-symbol interference (ISI). ISI represents a form of signal distortion whereby one symbol interferes with subsequent symbols. ISI is usually caused by multipath propagation, or the inherent non-linear frequency response of a channel causing successive symbols to blur together. Further, typically, an HPA operates most efficiently at or near saturation, however, operation of an HPA at or near saturation generates nonlinear distortion in output channels. ISI can be mitigated by reducing the transmission or throughput rate of the transmitter, however, a reduction in the throughput rate proportionately reduces bandwidth efficiency.

In order to increase system throughput, a logical goal would be to maximize the number of transponders/HPAs of the satellite transmission antenna. Due to physical limitations, however, there is a maximum number of HPA units that can fit in a single transponder. To combat this issue, multiple carriers can be shared by a single transponder HPA (multi-carrier operation), allowing for the transmission of more data and the servicing more users without exceeding the physical limitation on the number of HPAs per transponder. Another benefit of multicarrier operation is that it facilitates a reduction of the transmission symbol rate per carrier without sacrificing system throughput, which greatly eases the burden on hardware implementation. In a multicarrier system, however, the amplification of multiple carriers by way of a single HPA (driven at or near its saturation point for maximum efficiency) generates a large amount of nonlinear interference or distortion, which further contributes to performance degradation issues.

Additionally, in order to increase transmission throughput, the transmission rate or symbol rate (in the time domain) can be increased, without altering the spectral shape of the signal. Increasing the transmission throughput, however, further exacerbates ISI issues. According to the Nyquist theorem, there is an ideal transmission limit (the Nyquist rate) beyond which the ambiguity in ability to resolve symbols at the receiver increases—the maximum number of code elements per second that could be unambiguously resolved at the receiver. Transmission at the Nyquist rate mitigates ISI, while increasing the transmission throughput above the Nyquist rate (at a "faster than Nyquist (FTN)" rate) resulting in linear interference that exacerbates the issues of ISI.

Further, in order to increase spectral efficiency, it is desirable to pack channels closer together in the frequency domain, which results in increased throughput (e.g., in bits/second/Hz, where the Hz reflects the distance between adjacent channels). The spectral efficiency, however, is constrained by the roll-off factor, which reflects the rate of slope or steepness of a transmission function with respect to frequency. The slower the roll-off rate (or the higher the roll-off percentage or factor) the further apart the adjacent channels must be placed to mitigate adjacent channel interference (ACI). ACI results from extraneous power picked up from a signal in an adjacent channel (e.g., one channel bleeds-over into an adjacent channel). Accordingly, the slower the roll-off rate of a channel, the higher the signal power that can be picked up by an adjacent channel. Therefore, there is an inherent tradeoff between roll-off rate and spectral efficiency.

Accordingly, to maximize bandwidth efficiency of a system, two goals are to increase transmission throughput of a transponder (transmission rate) in the time domain, and to increase the rate or steepness of the roll-off (operate at a decreased or minimized roll-off factor or percentage). As described above, however, an increase in the transmission throughput beyond certain levels and tightening the roll-off contributes to both ISI and ACI. More specifically, the resulting interference manifests itself as a structured interference, which is significant and extends for a relatively longer period in the time domain (the interference tends to linger in time over many symbols, resulting in a significant degradation in performance). At the receiver, in view of the lengthened period of significant interference, the receiver must be configured to handle the increased interference levels, which would require increased complexity in the receiver. The longer the interference memory, the receiver must account for the possible sequences, which is exponential in the symbol alphabet over that memory. For example, with a 16APSK modulation scheme, the receiver would be required to consider 16 raised to the power of the channel interference memory signal possibilities in the decoding process. In other words, the receiver must be configured to account for a significantly increased number of possibilities for the transmitted signal before making a decoder decision.

Further, due to physical limitations of the satellite, there are a maximum number of HPA units that can fit in a transponder. To solve the issue of such physical limitations, sharing multiple carriers by a single transponder HPA (multicarrier operation) allows for transmitting more data and servicing more users. Another benefit of multicarrier operation is that it allows for reducing the transmission symbol rate per carrier without sacrificing system throughput. This greatly eases the burden on hardware implementation. When multiple carriers are amplified by way of a single HPA, and when the HPA is driven near its saturation point, a significant level of nonlinear interference is generated. Interference is an undesirable result of increasingly crowded spectrum, when multiple carriers share the same transponder high power amplifier (HPA). The transponder HPA transmits a maximum signal strength when operating at or near its saturation output power level. Operating near saturation, however, increases nonlinearities in the HPA, and such nonlinearities in the HPA result in nonlinear distortion (e.g., intermodulation distortion (IMD), which comprises unwanted amplitude and phase modulation of signals containing two or more different frequencies in a system with nonlinearities). The intermodulation between each frequency component will form additional signals at frequencies that are not, in general, at harmonic frequencies (integer multiples) of either, but instead often at sum and difference frequencies of the original frequencies. The spurious signals, which are generated due to the nonlinearity of a system, are mathematically related to the original input signals. When the spurious signals are of sufficient amplitude, they can cause interference within the original system or in other systems, and, in extreme cases, loss of transmitted information, such as voice, data or video.

IMD causes interference within a message itself as well as between the message signals by transferring modulations from one frequency range to another. The problem is particularly acute when a cost effective nonlinearized HPA is operated with minimal output back-off (OBO). OBO is the amount (in dB) by which the output power level of the HPA is reduced, or "backed-off," from the saturation output power level. The problem is further compounded when the carriers passing through the HPA are bandwidth efficient, whose constellations include multiple concentric rings, and the carriers are tightly spaced within the limited spectrum. The interference issues are further complicated when transmission throughput of a transponder (the symbol transmission rate) is increased in the time domain (e.g., an FTN rate) and the rate or steepness of the roll-off is increased. As described above, however, an increase in the transmission throughput beyond certain levels (e.g., the Nyquist level) and tightening the roll-off contributes to both ISI and ACI.

Band-pass filtering can be an effective way to eliminate most of the undesired products without affecting in-band performance. However, third order intermodulation products are usually too close to the fundamental signals and cannot be easily filtered. The amplitude and phase distortion is unacceptable in systems that use higher order modulation schemes, because the distortion results in an error component in the received vector, degrading the receiver's bit error rate (BER). Other attempts to compensate for nonlinear interference have been complex and require receivers to exchange information. For instance, a conventional system compensates for linear and nonlinear IS) and linear and nonlinear adjacent channel interference (ACI) due to the nonlinearlity of HPA and tight crowding of carriers in a transmitter HPA or transmitter section of a transponder HPA. However, such a system requires receivers to coordinate samples from adjacent carriers, resulting in increased system complexity and computational effort.

What is needed, therefore, is an approach for increasing the transmission throughput of a wireless transmitter or transponder HPA driven at or near saturation, while being able to efficiently decode the transmitted signal at a receiver.

SOME EXAMPLE EMBODIMENTS

The present invention advantageously addresses the needs above, as well as other needs, by providing a system that applies faster-than-Nyquist "FTN" transmission symbol rates combined with tight frequency roll-off, employs modification of the transmitted symbols by applying dynamic pre-distortion within the transmitter to minimize the distortion of the received symbols. The present invention advantageously addresses the needs above, as well as other needs, by further providing a system that employs a receiver that includes novel interference compensation techniques (capable of handling the enhanced level of non-linear distortion or interference attributable to the HPAs of the satellite transponders, and the linear interference resulting from the IMUX and OMUX filters of the satellite transponders, and the linear interference or enhanced ISI memory attributable to the FTN transmission rates), while maintaining a complexity that does not grow exponentially with the interference memory and signal constellation size.

In accordance with a first example embodiment of the present invention, an apparatus comprises a signal input configured to receive a source signal comprising a plurality of source symbols, and an encoder module configured to receive the source signal and to encode the source signal to generate a corresponding encoded signal. The apparatus further comprises a modulator module configured to receive the encoded signal and to modulate the encoded signal by mapping each source symbol to a respective signal constellation point of an applied signal constellation to generate a modulated signal, and a pre-distorter module configured to receive the modulated signal and to pre-distort the modulated signal based on a distortion estimate to generate a pre-distorted signal. The apparatus further comprises a filter module configured to receive the pre-distorted signal and to filter the pre-distorted signal to generate a filtered signal, and a transmitter module configured to receive the filtered signal and to frequency translate and amplify the filtered signal to generate a transmission signal for transmission to a satellite via an uplink channel of a satellite communications system. To increase system throughput, the source signal is processed through the apparatus and the resulting transmission signal is generated with one or more of a faster than Nyquist (FTN) symbol rate and a tight frequency roll-off. By way of example, for pre-distorting the modulated signal, the pre-distorter module is configured to pre-compensate for distortion to which the source signal would be subjected as a result of one or more of processing through the apparatus for transmission via the uplink channel to a satellite, processing by at least one transponder of the satellite for transmission to a receiver apparatus via a downlink channel of the satellite communications system and processing by the receiver apparatus. By way of further example, for pre-distorting the modulated signal, the pre-distorter module is configured to estimate distortion that would result from passing the encoded signal through one or more of the modulator module, the filter module, the transmitter module, a downlink transponder of the satellite and a filter module of a receiver apparatus, and to subtract a factor of the estimated distortion from each symbol of the modulated signal.

According to a further example embodiment, the pre-distorter module comprises a multi-stage pre-distorter, and the pre-distorter module is configured to apply the pre-distortion repeatedly in a multi-stage pre-distortion process. By way of example, for pre-distorting the modulated signal via the multi-stage pre-distortion process, the pre-distorter module is configured to: in a first stage, estimate a first-stage distortion that would result from passing the encoded signal through one or more of the modulator module, the filter module, the transmitter module, a downlink transponder of the satellite and a filter module of a receiver apparatus, and subtract a factor of the estimated distortion from each symbol of the modulated signal to generate a first-stage pre-distorted signal; and in a second stage, estimate a second-stage distortion that would result from passing the first-stage pre-distorted signal through one or more of the modulator module, the filter module, the transmitter module, a downlink transponder of the satellite and a filter module of a receiver apparatus, and subtract a factor of the estimated second-stage distortion from each symbol of the first-stage pre-distorted signal to generate a second-stage pre-distorted signal. By way of further example, the multi-stage pre-distortion process is performed for a predetermined number of stages, wherein the estimation of the distortion for a current stage is based on a pre-distorted signal of the previous stage, and a factor of the estimated distortion for the current stage is subtracted from each symbol of the pre-distorted signal of the previous stage to generate a current-stage pre-distorted signal. The predetermined number of stages is based on a desired quality of performance and a desired spectral shape of the transmitted signal.

In accordance with a second example embodiment of the present invention, a method comprises receiving a source signal comprising a plurality of source symbols. The source signal is encoded to generate a corresponding encoded signal. The encoded signal is modulated by mapping each source symbol to a respective signal constellation point of an applied signal constellation to generate a modulated signal. The modulated signal is pre-distorted based on a distortion estimate to generate a pre-distorted signal. The pre-distorted signal is filtered to generate a filtered signal. The filtered signal is frequency translated and amplified to generate a transmission signal for transmission to a satellite via an uplink channel of a satellite communications system. To increase system throughput, the source signal is processed through the apparatus and the resulting transmission signal is generated with one or more of a faster than Nyquist (FTN) symbol rate and a tight frequency roll-off. By way of example, the pre-distortion of the modulated signal comprises pre-compensating for distortion to which the source signal would be subjected as a result of one or more of processing through a transmitter device for transmission via the uplink channel to a satellite, processing by at least one transponder of the satellite for transmission to a receiver device via a downlink channel of the satellite communications system and processing by the receiver device. By way of further example, the pre-distortion of the modulated signal comprises estimating distortion that would result from passing the encoded signal through one or more of the modulation, the filtering, the frequency translation and amplification, a downlink transponder of the satellite and a filtering by a receiver apparatus, and subtracting a factor of the estimated distortion from each symbol of the modulated signal.

According to a further example embodiment, the pre-distortion is performed repeatedly in a multi-stage pre-distortion process. By way of example, the multi-stage pre-distortion process comprises: in a first stage, estimating a first-stage distortion that would result from passing the encoded signal through one or more of the modulation, the filtering, the frequency translation and amplification, a downlink transponder of the satellite and a filtering by a receiver apparatus, and subtracting a factor of the estimated distortion from each symbol of the modulated signal to generate a first-stage pre-distorted signal; and in a second stage, estimating a second-stage distortion that would result from passing the first-stage pre-distorted signal through one or more of the modulation, the filtering, the frequency translation and amplification, a downlink transponder of the satellite and a filtering by a receiver apparatus, and subtracting a factor of the estimated second-stage distortion from each symbol of the first-stage pre-distorted signal to generate a second-stage pre-distorted signal. By way of further example, the multi-stage pre-distortion process is performed for a predetermined number of stages, wherein the estimation of the distortion for a current stage is based on a pre-distorted signal of the previous stage, and a factor of the estimated distortion for the current stage is subtracted from each symbol of the pre-distorted signal of the previous stage to generate a current-stage pre-distorted signal. The predetermined number of stages is based on a desired quality of performance and a desired spectral shape of the transmitted signal.

In accordance with a third example embodiment of the present invention, a system comprises a transmitter device and a receiver device. The transmitter device comprises a signal input configured to receive a source signal comprising a plurality of source symbols, and an encoder module configured to receive the source signal and to encode the source signal to generate a corresponding encoded signal. The transmitter device further comprises a modulator module configured to receive the encoded signal and to modulate the encoded signal by mapping each source symbol to a respective signal constellation point of an applied signal constellation to generate a modulated signal, and a pre-distorter module configured to receive the modulated signal and to pre-distort the modulated signal based on a distortion estimate to generate a pre-distorted signal. The transmitter device further comprises a filter module configured to receive the pre-distorted signal and to filter the pre-distorted signal to generate a filtered signal, and a transmitter module configured to receive the filtered signal and to frequency translate and amplify the filtered signal to generate a transmission signal for transmission to a satellite via an uplink channel of a satellite communications system To increase system throughput, the source signal is processed through the apparatus and the resulting transmission signal is generated with one or more of a faster than Nyquist (FTN) symbol rate and a tight frequency roll-off. The receiver device is configured to receive a signal transmitted from the satellite via a downlink channel of the satellite communications system. The received signal reflects the transmission signal as received by the satellite, wherein the received signal includes one or more of linear inter-symbol interference (ISI) effects induced based on the one or more of the faster-than-Nyquist (FTN) symbol rate and the tight frequency roll-off, and non-linear interference effects induced based on high-power amplification by the satellite for the transmission via the downlink channel. The receiver module is configured to process the received signal based on a plurality of decoding iterations. The receiver module comprises a likelihood metric computing module configured to generate a set of soft information of a current decoding iteration based on a current estimate of the source signal and a final set of soft information from a previous decoding iteration, wherein the current estimate of the source signal is based on an estimate of the linear ISI effects and the non-linear interference effects, which is based on the final set of soft information from the previous decoding iteration.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIG. 8A illustrates bit-to-symbol labeling for a 1+7 APSK constellation, in accordance with example embodiments of the present invention;

DETAILED DESCRIPTION

A system that applies faster-than-Nyquist "FTN" transmission symbol rates, combined with tight frequency roll-off, and employs a receiver that includes novel interference compensation techniques (capable of handling the enhanced level of non-linear distortion or interference attributable to the HPAs of the satellite transponders, and the linear interference resulting from the IMUX and OMUX filters of the satellite transponders, and the linear interference or enhanced ISI memory attributable to the FTN transmission rates), is described. In the following description, for the purposes of explanation, numerous specific details are set forth in order to provide a thorough understanding of the invention. It is apparent, however, that the invention may be practiced without these specific details or with an equivalent arrangement. In other instances, well known structures and devices are shown in block diagram form in order to avoid unnecessarily obscuring the invention.

Figure 1A:
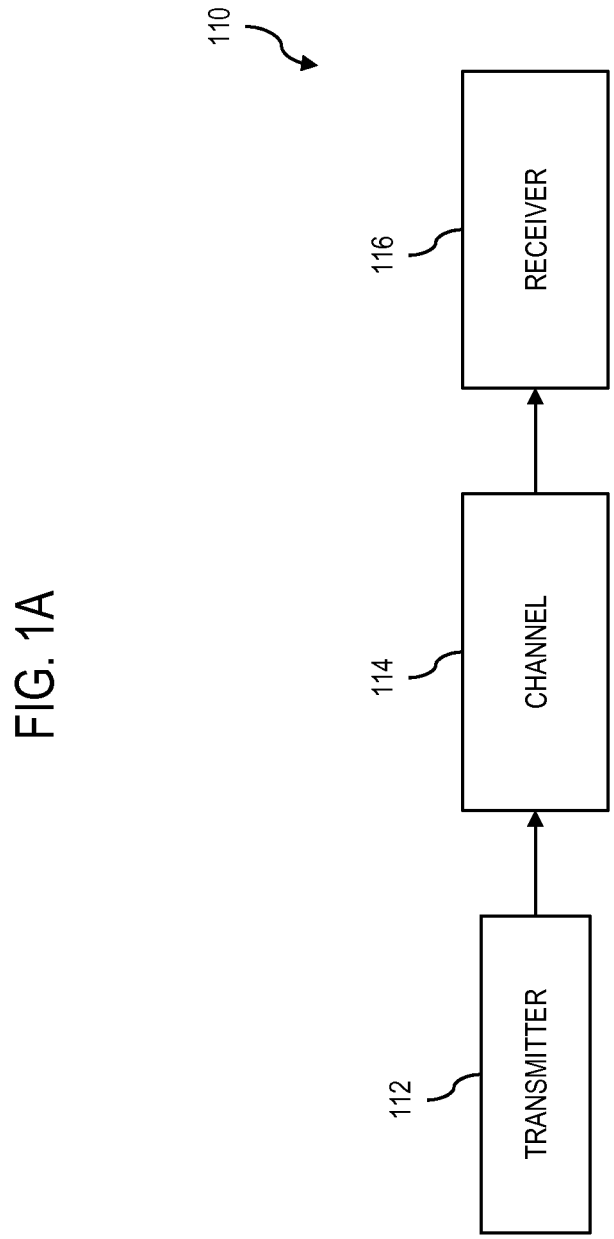
FIGS. 1A and 1B illustrate communications systems capable of employing an interference compensation system and algorithms, in accordance with example embodiments of the present invention.

FIG. 1A illustrates a block diagram of a communications system capable of employing an interference compensation system and algorithms, in accordance with example embodiments of the present invention. With reference to FIG. 1A, a broadband communications system 110 includes one or more transmitters 112 (of which one is shown) that generate signal waveforms across a communications channel 114 to one or more receivers 116 (of which one is shown). In this discrete communications system 110, the transmitter 112 has a signal source that produces a discrete set of data signals, where each of the data signals has a corresponding signal waveform. These signal waveforms are attenuated, or otherwise altered, by communications channel 114. Coding may be utilized to combat noise and other issues associated with the channel 114, such as forward error correction (FEC) codes.

Figure 1B:
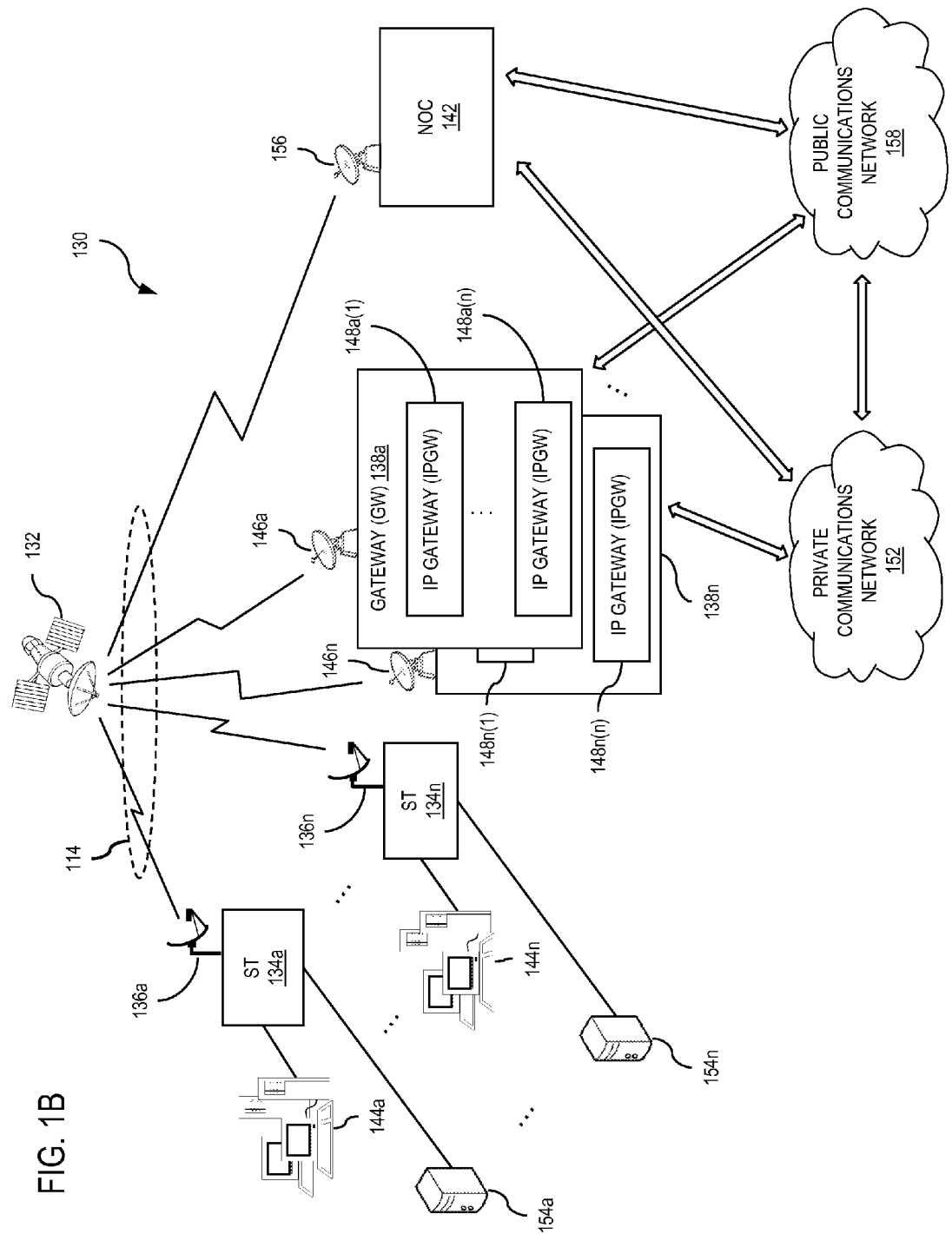

FIG. 1B illustrates an example satellite communications system 130 capable of supporting communications among terminals with varied capabilities, including an interference compensation system and algorithms, in accordance with example embodiments of the present invention. Satellite communications system 130 includes a satellite 132 that supports communications among multiple satellite terminals (STs) 134a-134n, a number of gateways (GWs) 138a-138n, and a network operations center (NOC) 142. The STs, GWs and NOC transmit and receive signals via the antennas 136a-136n, 146a-146n, and 156, respectively. According to different embodiments, the NOC 142 may reside at a separate site reachable via a separate satellite channel or may reside within a GW site. The NOC 142 performs the management plane functions of the system 130, while the GWs 138a-138n perform the data plane functions of the system 133. For example, the NOC 142 performs such functions as network management and configuration, software downloads (e.g., to the STs 134a-134n), status monitoring, statistics functions (e.g., collection, aggregation and reporting), security functions (e.g., key generation, management and distribution), ST registration and authentication, and GW diversity management. The NOC 142 communicates with each GW via the satellite 132, or via a secure private communications network 152 (e.g., an IPsec tunnel over a dedicated link or a virtual private network (VPN) or IPsec tunnel through a public network, such as the Internet). It should be noted that, according to one example embodiment, the traffic classification approaches of embodiments of the present invention address classification of data traffic flowing through an aggregation point or node. Additionally, each GW and the NOC have connectivity to one or more public communications networks, such as the Internet or a PSTN.

According to a further example embodiment, each of the GWs 138a-138n include one or more IP gateways (IP-GWs)—whereby the data plane functions are divided between a GW and its respective IPGWs. For example, GW 138a includes IPGWs 148a(1)-148a(n) and GW 138n includes IPGWs 148n(1)-148n(n). A GW may perform such functions as link layer and physical layer outroute coding and modulation (e.g., DVB-S2 adaptive coding and modulation), link layer and physical layer inroute handling (e.g., IPOS), inroute bandwidth allocation and load balancing, outroute prioritization, web acceleration and HTTP compression, flow control, encryption, redundancy switchovers, and traffic restriction policy enforcement. Whereas, the IPGW may perform such functions as data compression, TCP performance enhancements (e.g., TCP performance enhancing proxies, such as TCP spoofing), quality of service functions (e.g., classification, prioritization, differentiation, random early detection (RED), TCP/UDP flow control), bandwidth usage policing, dynamic load balancing, and routing. Further, a GW and respective IPGW may be collocated with the NOC 142. The STs 134a-134n provide connectivity to one or more hosts 144a-144n and/or routers 154a-154n, respectively. The Satellite communications system 130 may operate as a bent-pipe system, where the satellite essentially operates as a repeater or bent pipe. Alternatively, the system 130 may employ a switching or processing satellite supporting mesh communications (point-to-point communications directly between, for example, the two STs 134a and 134n).

In a bent-pipe system of an example embodiment, the satellite 132 operates as a repeater or bent pipe, and communications to and from the STs 134a-134n are transmitted over the satellite 132 to and from respective IPGWs associated with particular STs. Further, in a spot beam system, any one spot beam operates as a bent-pipe to geographic region covered by the beam. For example, each spot beam operates as a bent pipe communications channel to and from the STs and/or IPGW(s) within the geographic region covered by the beam. Accordingly, signal transmissions to the satellite are either from an ST and destined for an associated gateway, or from a gateway and destined for an associated ST. According to one embodiment, several GWs/IPGWs are distributed across the geographic region covered by all spot beams of the satellite 132, where, in a beam in which a GW (and respective IPGWs) are located, only the one GW (and no STs) occupies that beam. Further, each IPGW may serve as an aggregation node for a multitude of remote nodes or STs. The total number of GWs/IPGWs, and the geographic distribution of the GWs/IPGWs, depends on a number of factors, such as the total capacity of the satellite dedicated to data traffic, geographic traffic loading of the system (e.g., based on population densities and the geographic distribution of the STs), locations of available terrestrial data centers (e.g., terrestrial data trunks for access to public and private dedicated networks).

Figure 2:
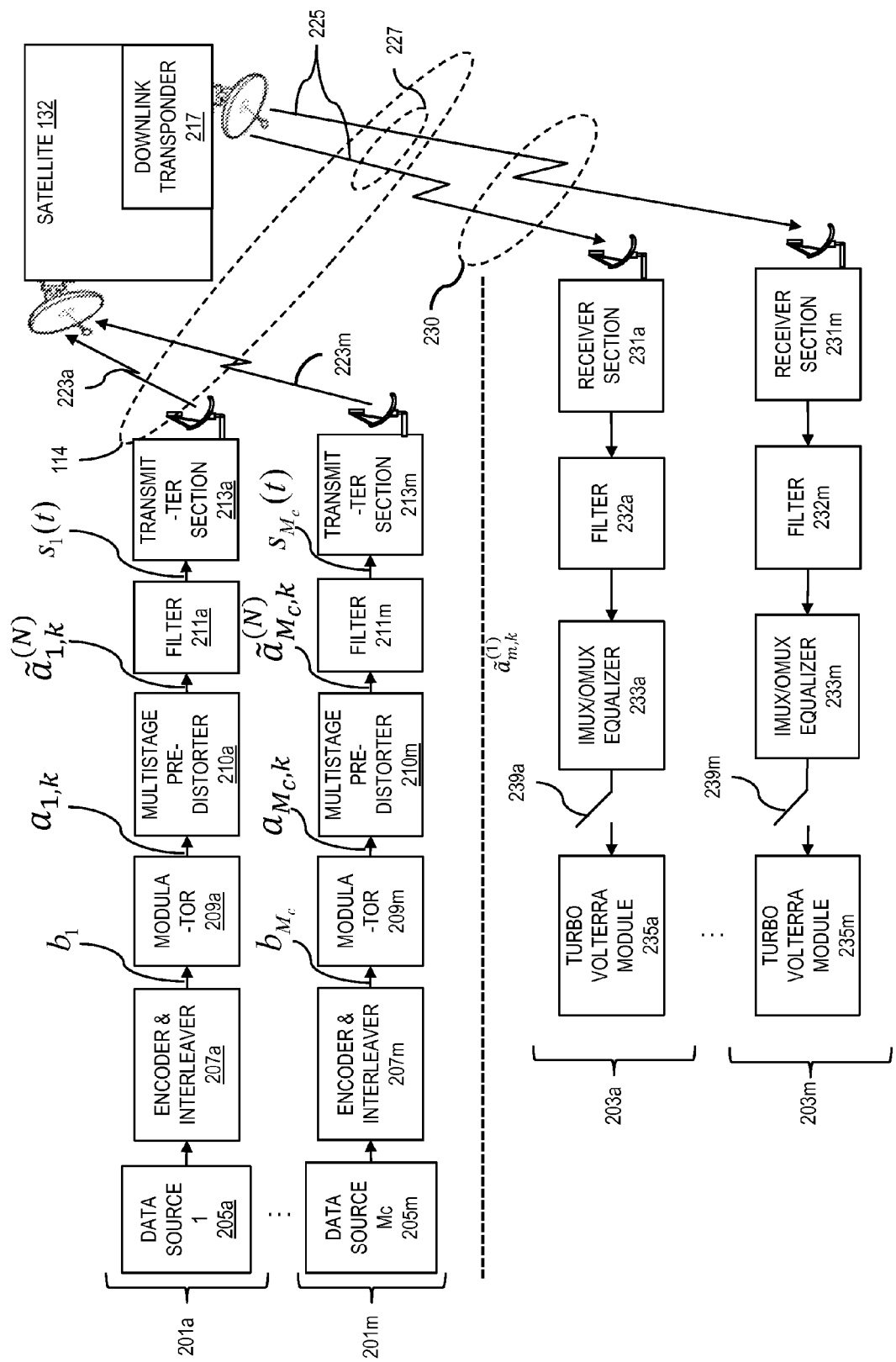
FIG. 2 illustrates a block diagram depicting an example transmitter and receiver of the communications system of FIGS. 1A and 1B, in accordance with example embodiments of the present invention.

FIG. 2 illustrates a block diagram depicting an example transmitter and receiver of the communications system of FIGS. 1A and 1B, where the receiver employs a Turbo Volterra Module for interference compensation and algorithms, in accordance with example embodiments of the present invention. While embodiments of the present invention are not limited to a satellite communications system, for the purpose of explanation, the following description envisions an embodiment encompassing the satellite communications system 130 of FIG. 1B. As illustrated in FIG. 2, the communication system includes transmitters 201 (201a-201m) and receivers 203 (203a-203m), with the signals being transmitted over the channel 114, via the transponder/amplifier 217, where the transponder/amplifier 217 comprises components of the transmission section of the satellite 132. The transmitters 201a-201m and receivers 203a-203m may represent a corresponding number of STs 134 and GWs 138. By way of example, a particular transmission 223a may reflect a transmission of data from a data source 205a (e.g., the host 144a), by the ST 134a, and destined for the GW 138a, where the receiver portion of the GW 138a may comprise the receiver 203a. A transmitter 201, in accordance with example embodiments, generally comprises at least one data or signal source 205, an encoder section 207, a modulator section 209, a filter section 211 and a transmitter section 213 (e.g., an upconverter/amplifier section). A receiver 203, in accordance with example embodiments, generally comprises a receiver section 231, an IMUX/OMUX equalizer section 233, a filter section 232, a sampler module 239, and a Turbo Volterra Module 235 (which includes de-interleaver and decoder sections, as depicted in FIG. 7).

According to one example embodiment the satellite system comprises a bent-pipe system, where the satellite acts as a repeater (as described above). The transponder of such a communications satellite comprises a series of interconnected components that for a communications channel between the satellite receive and transmit antennas. At the receive side, a typical transponder generally comprises an input band limiting device (e.g., a band pass filter), an input low-noise amplifier (LNA) (which amplifies the received signal to compensate for the significant weakening of the signal due to large distance traveled between the earth station transmitter and the satellite), and an input multiplexer (IMUX) (which generally comprises filter banks that channelize the receive band into the individual channels). At the transmit side, a typical transponder generally comprises a frequency translator (which converts the frequency of the received signal to the frequency required for the transmitted signal), an output band-limiting device (e.g., a band=pass filter), and a downlink high power amplifier (HPA) (which amplifies the signal for transmission back down to an earth station receiver). In one embodiment, due to the physical limitations of the number of HPAs that can fit in the downlink transmission section of the satellite 132, to maximize bandwidth efficiencies (e.g., to increase bandwidth and data throughput), multiple received uplink channels or carrier signals can be multiplexed onto a single wideband carrier of a single downlink transponder HPA 217 (a wideband multi-carrier system). In such a multicarrier system, the downlink transponder will also include a signal combiner section or output multiplexer (OMUX), which combines the uplink transponder channels or carrier signals that are switched for transmission to a common downlink cell 230. The OMUX thereby generates a combined transmission signal for transmission via the HPA for the particular transmit signal or downlink beam 225.

Accordingly, in such a multi-carrier system, the satellite aggregates multiple received uplink data signals (e.g., data signals destined for a particular geographic region serviced by a particular downlink beam of the satellite), where each uplink data signal is carried by a separate carrier. The satellite simultaneously transmits the aggregate data signal over the single downlink channel 227 to the single downlink cell 230, which is transmitted via a single downlink transponder HPA 217, on a single downlink signal 225. During transmission over the downlink channel 227, the transmitted downlink signal 225 will encounter various physical effects that manifest as noise experienced in the received signal. The added channel noise typically may be idealized as additive white Gaussian noise. Hence, the transmitted signal 225 reflects multiple source data signals 223a-223m, respectively carrying data generated by the different data sources 205a-205m. While a variable number of data signals may be transmitted over the satellite 132 via such a multi-carrier system, however, for purposes of simplification, the following description envisions an embodiment encompassing data signals from two signal sources 205a and 205m, respectively transmitted via the uplink transmission signals 223a and 223m, and combined via the satellite and transmitted back via the downlink transmission signal 225.

According to an example embodiment, in operation, data or signal source 205a outputs a first source signal to encoder 207a, where the first source signal reflects a sequence of source data symbols for transmission over the communications system. Encoder 207a generates an encoded vector signal $b_1$ from the first source signal. In one embodiment, encoder 207a is an error correction encoder that adds information to reduce information loss at the receive section 203. Additionally, or alternatively, the encoder 207a interleaves data from the first source signal into the encoded vector signal. Modulator 209a receives the encoded vector signal and generates a modulated discrete signal $a_1(t)$, where each source symbol is mapped to a respective signal constellation point of the signal constellation of the applied modulation scheme. In one embodiment, modulators 209 are Gray-coded Quadrature Amplitude Modulation (QAM) modulators or Amplitude and Phase Shift Keyed (APSK) modulators (e.g., QPSK, 8PSK, 16APSK or 32APSK modulators). Accordingly, depending on the applied modulation scheme, each source symbol represents a number of source data bits, where (via the applied modulation) each source symbol is mapped to an associated signal constellation point and transmitted to the satellite via a common uplink transmission carrier. For example, with 16APSK modulation, each of the 16 constellation points represents or corresponds to an arrangement of four source data bits (e.g., 0000, 0001, 0010, . . . , 1111), and (via the applied modulation) each received data symbol is mapped to its corresponding or associated constellation point. In one embodiment, the discrete signal output of the modulator 209 (e.g., the modulated signal) may be represented as:

$$a_m(t) = \sum_{k=-\infty}^{\infty} a_{m,k} \delta(t - kT_s - \varepsilon_m T_s) \quad (1)$$

where $\{a_{m,k}; m=1, \ldots, M_c\}$ are sets of complex valued data symbols, $\delta(t)$ is the Dirac delta function, and $\varepsilon_m$ represents the normalized difference in signal arrival times.

Filter 211a receives the modulated discrete signal $a_1(t)$ and generates a continuous filtered signal $s_1(t)$ reflecting the data of the modulated discrete signal. In one embodiment, filter 211a is a pulse shaping filter with impulse responses $P_{m,T}(\tau)$ to generate the signal $s_m(t)$ as:

$$s_m(t) = \int_{-\infty}^{\infty} a_m(t-\tau) P_{m,T}(\tau) d\tau \quad (2)$$

Alternatively, in the discrete representation:

$$s_m(t) = \sum_{k=-\infty}^{\infty} a_{m,k} * p_{m,T}(t - k\tau T_s), \tau \leq 1 \quad (3)$$

where $\{a_{m,k}; m=1, \ldots, M_c\}$ are sets of complex-valued data symbols, $M_c$ represents the number of carriers, and $p_{m,T}(t)$ are impulse responses of the pulse shaping filters.

Figure 3:
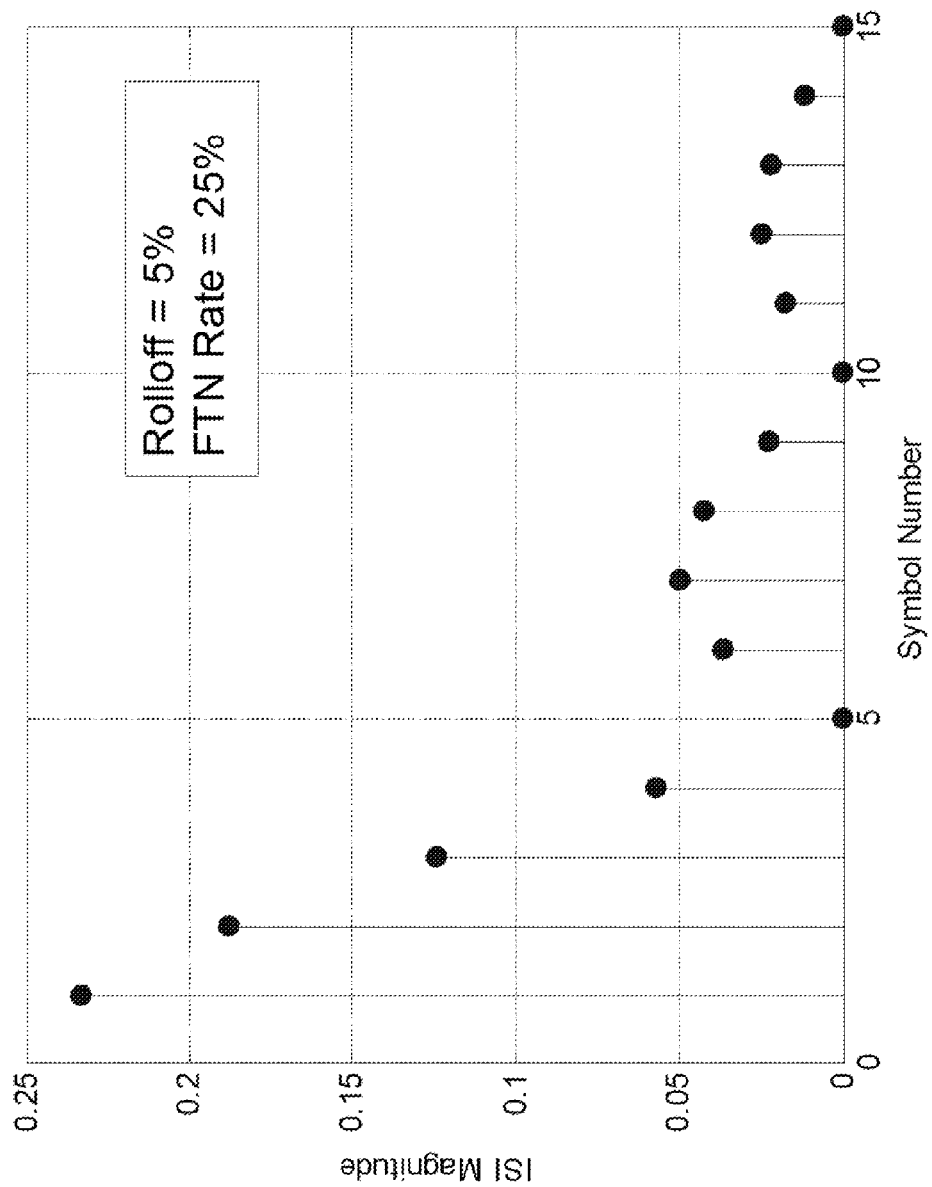
FIG. 3 illustrates the ISI introduced in the case of sharp spectral roll-off (where the roll-off is 5% and the FTN rate is 25%), in accordance with example embodiments of the present invention.

In the foregoing signal representations for $s_m(t)$, $1/\tau$ is the transmission throughput rate. In traditional communications systems (based on the Nyquist theorem) the rate $1/\tau$ is set at or below unity, which avoids ISI for pulses that are orthogonal to integral shifts of $T_s$. According to example embodiments of the present invention, however, to increase the system throughput rate, the transmission symbol rate is set at a faster than Nyquist rate (FTN rate), wherein the rate of $1/\tau$ is configured to be greater than unity. Such rates result in linear interference (e.g., structured ISI) that needs to be mitigated at the receiver. Further, the FTN-induced ISI has a memory span that increases with sharper spectral roll-off and more aggressive FTN rates. FIG. 3, for example, illustrates the ISI introduced in the case of sharp spectral roll-off (where the roll-off is 5% and the FTN rate is 25%), in accordance with example embodiments of the present invention. As shown in FIG. 3, the ISI introduced by time packing (FTN rates) for spectrally efficient signals decays at a low rate, spanning as many as 15 symbols on either side. Mitigating this type of ISI using receivers of exponential complexity in terms of signal constellation size and ISI memory length would be prohibitively complex. Alternatively, such FTN and roll-off induced ISI can be efficiently mitigated using receivers whose complexity is non-exponential in terms of signal constellation size and ISI memory length, in accordance with example embodiments of the present invention.

According to one embodiment, the filter 211a ($P_{m,T}(\tau)$) may model the cascade of pulse-shaping filters and the on-board input multiplexing filter (IMUX) of the satellite 132. The individual signals $s_m(t)$ are then frequency-translated to their respective slot or center frequency. By way of example, to generate the first continuous carrier signal, the transmitter section 213a mixes the continuous filtered signal from the filter 211a with a local oscillator signal to generate the desired carrier signal, where the oscillator signal may be represented as $\exp(j(2\pi f_1 t + \theta_1))/\sqrt{M_c}$, where $f_1$ and $\theta_1$ represent the center frequency and carrier phase of the first carrier signal, to generate a first continuous carrier signal for transmission over the uplink channel 223a to the satellite 132. Additional continuous carrier signals, for transmitting the data source signals (e.g., from data source 205m), may be generated using similar processes, where each additional continuous carrier signal would be of a different center frequency and carrier phase (e.g., for source 205m, $f_m$ and $\theta_m$).

Figure 4A:
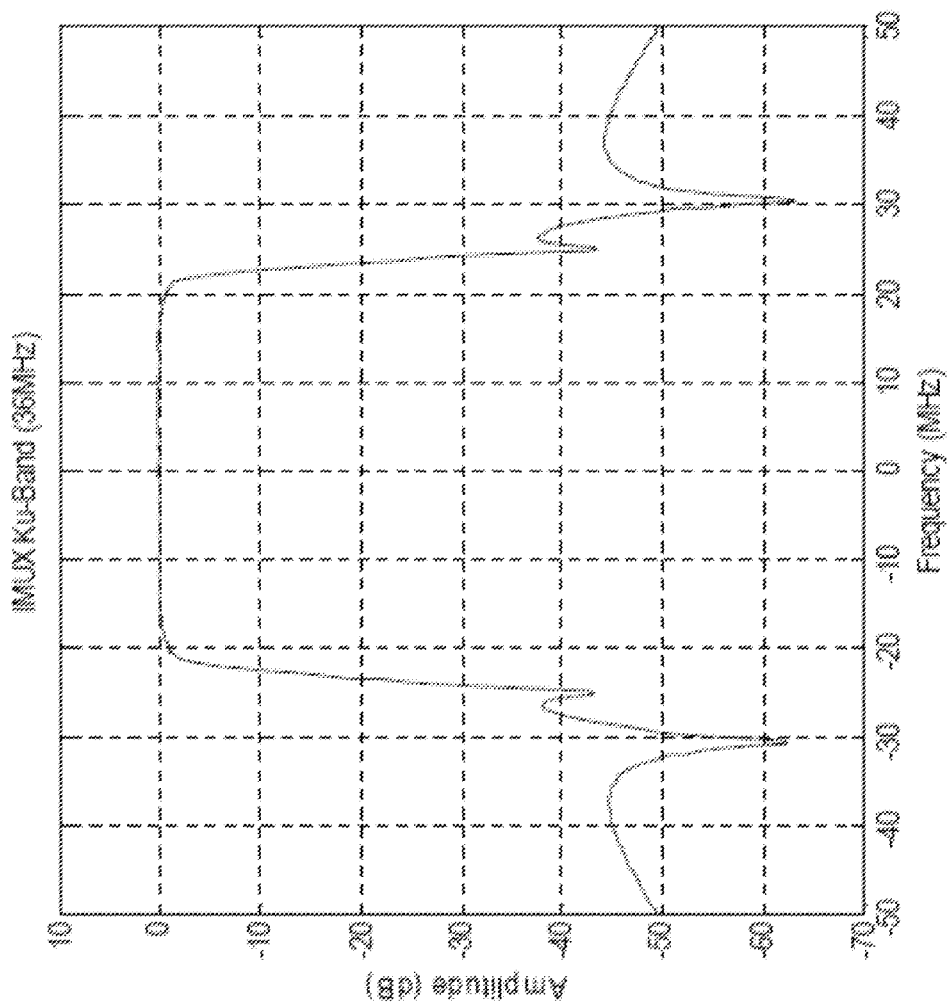
FIGS. 4A and 4B illustrate example amplitude and group delay responses of a typical input multiplexer (IMUX) of the satellite of FIG. 1B, in accordance with example embodiments of the present invention.
Figure 4B:
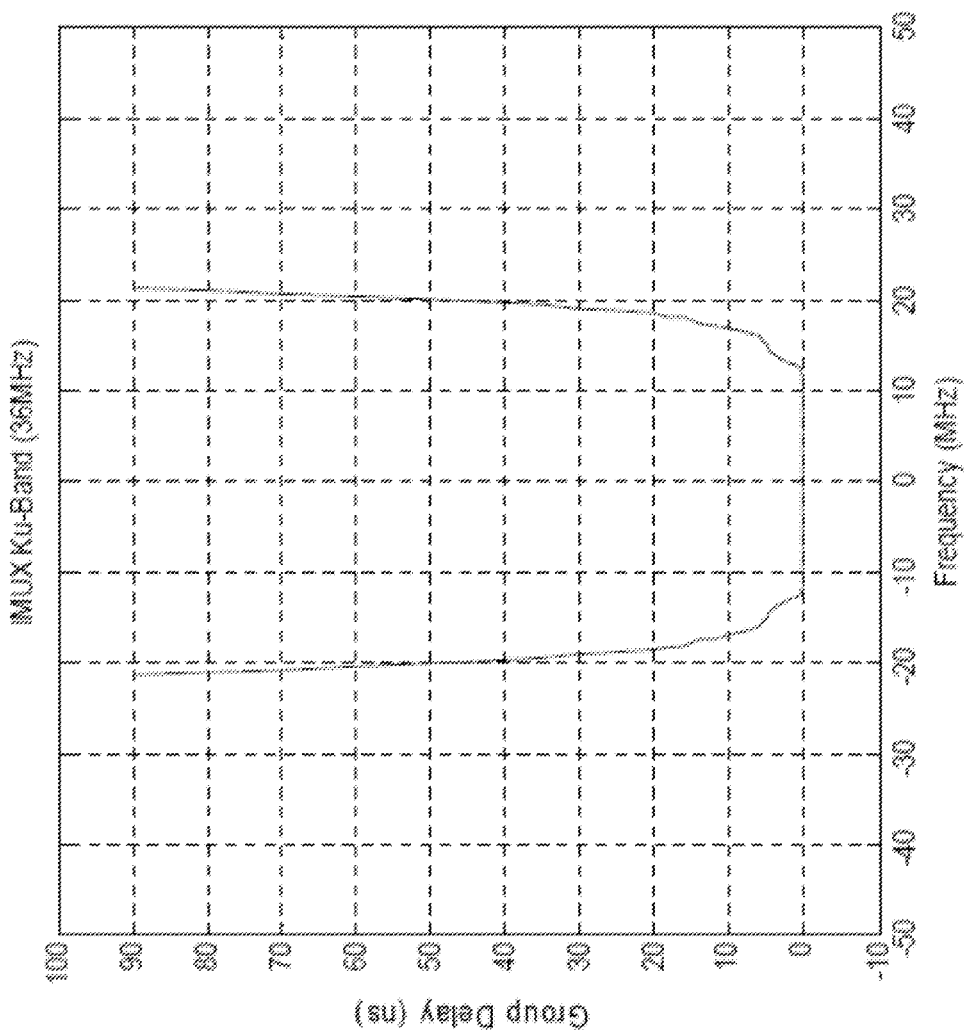

Each of the discrete signals (e.g., 223a through 223m) are transmitted to the satellite 132 by the associated transmitter terminals (e.g., 201a through 201m, respectively) via respective carriers at different carrier frequencies. Once received by the satellite 132, based on the respective carrier frequency of each of the received signals and the destination downlink cell 230, the satellite forms a composite signal for transmission via a respective transponder to the destination downlink cell. The composite signal can be represented in complex form as:

$$s_c(t) = \sum_{m=1}^{M_c} s_m(t) \frac{\exp(j(2\pi f_m t + \theta_m))}{\sqrt{M_c}} \quad (4)$$

where $f_m$ and $\theta_m$ are the center frequency and carrier phase of the $m^{th}$ uplink channel, respectively. The composite signal is then processed via the respective satellite downlink transponder within the transmit section of the satellite 132 (e.g., downlink transponder 217). Within the downlink transponder 217, the composite signal is processed through an IMUX filter (e.g., to select the desired carrier and remove any adjacent carriers). In other words, in a multicarrier system, the IMUX selects the desired channel/carrier and filters out the other channels/carriers, and the desired carrier then passes through the HPA individually. The IMUX thereby tunes the transponder to the desired carrier frequency for the transmission channel. The IMUX, however, produces amplitude distortion and group delay and the group delay causes linear ISI. FIGS. 4A and 4B illustrate example amplitude and group delay responses of a typical input multiplexer (IMUX) of the satellite 132, in accordance with example embodiments of the present invention.

Figure 5A:
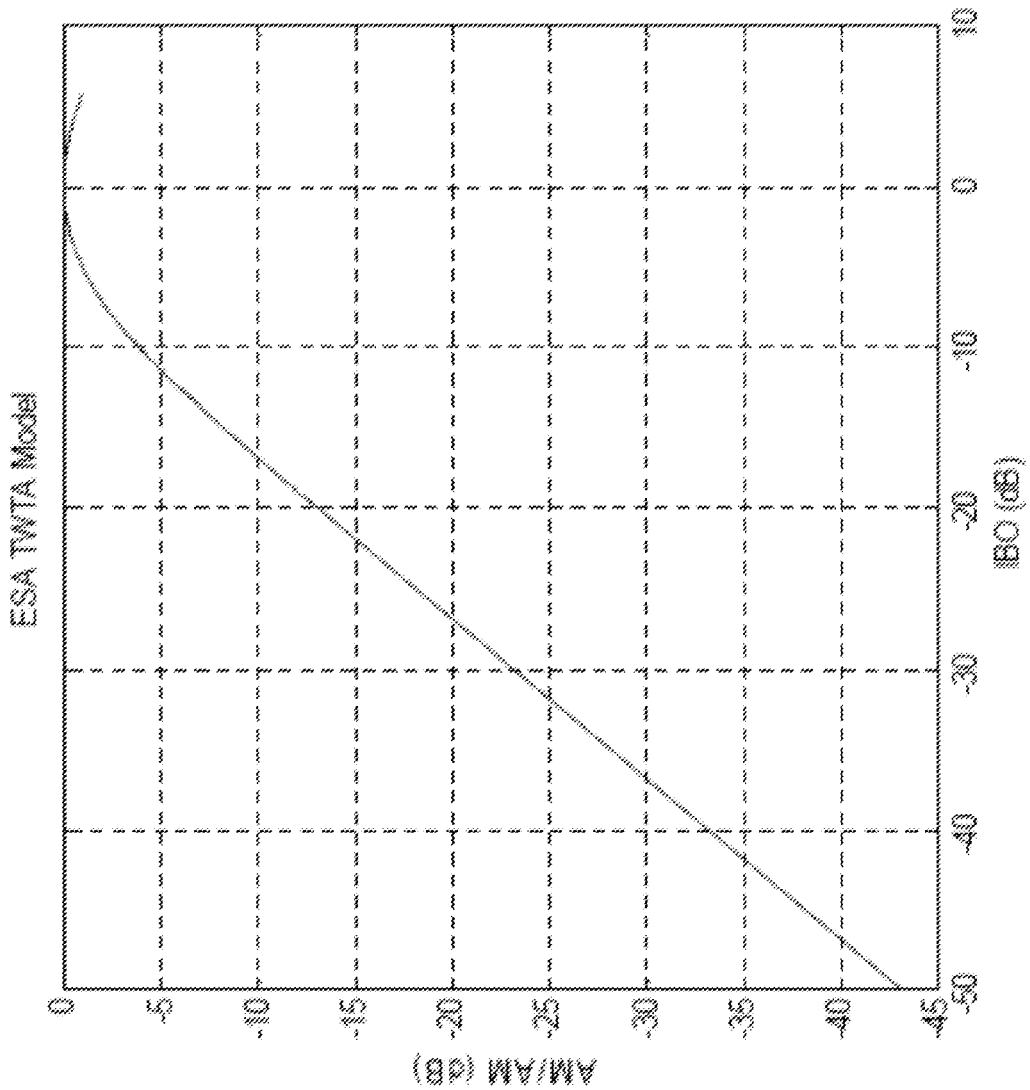
FIGS. 5A and 5B illustrate example non-linearized AM/AM and AM/PM distortion characteristics of a typical traveling wave tube amplifier (TWTA) of the satellite of FIG. 1B, in accordance with example embodiments of the present invention.
Figure 5B:
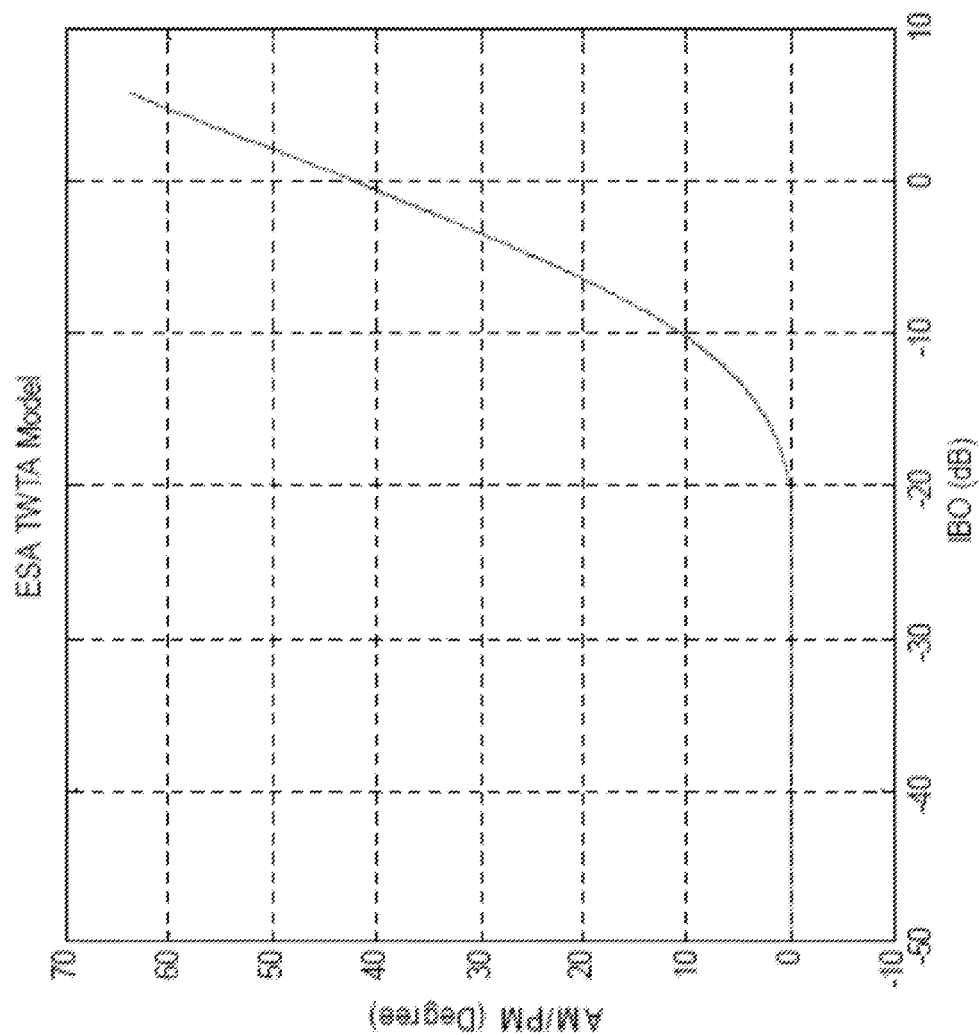
Figure 6A:
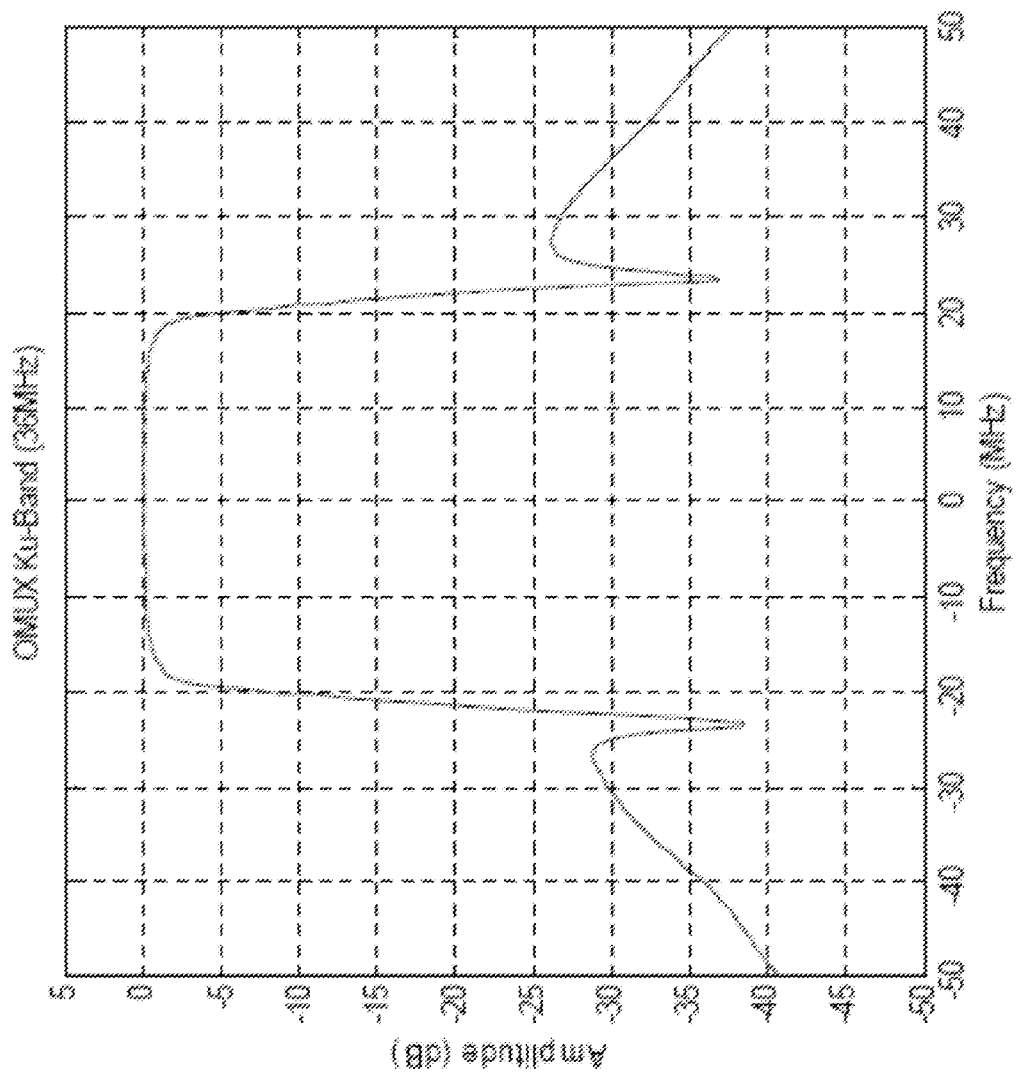
FIGS. 6A and 6B illustrate example amplitude and group delay responses of a typical output multiplexer (OMUX) of the satellite of FIG. 1B, in accordance with example embodiments of the present invention.
Figure 6B:
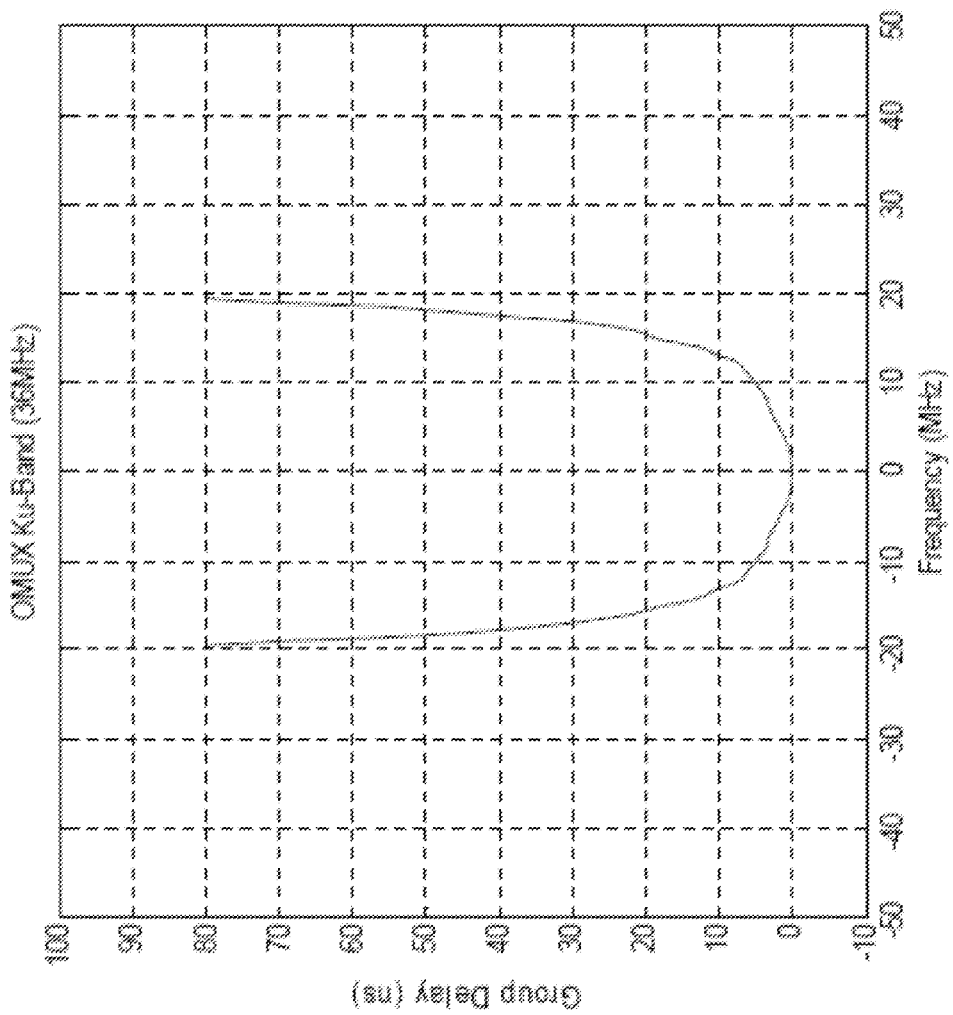

Further, downlink transponder 217 amplifies the composite signal (e.g., via an HPA) to generate the downlink transmission signal 225, which is transmitted to the respective downlink cell 230. In one embodiment, to achieve a maximum efficiency of the downlink transponder 217 (e.g., to achieve a maximum output power without overly distorting the amplified signal, and thereby achieve power and bandwidth or data throughput efficiencies), the HPA is driven near or to its saturation level, while the back-off is minimized. The HPA thereby operates in the nonlinear region of its output range, and, in view of the multiple uplink signals being transmitted simultaneously, the uplink signal carriers interact with or affect each other in a nonlinear fashion. Additionally, to achieve further efficiency, the system may be designed such that a single downlink HPA 217 may be transmitting signals of differing rates, employing multiple rate constellations (e.g., QPSK, 8PSK, 16APSK, 32APSK, etc.). By way of example, the HPA may comprise a traveling wave tube amplifier (TWTA)) operating at an optimized back-off level (e.g., driven at or near saturation). FIGS. 5A and 5B illustrate example non-linearized AM/AM and AM/PM distortion characteristics of a typical traveling wave tube amplifier (TWTA) of the satellite 132, in accordance with example embodiments of the present invention. These graphs illustrate the non-linear distortion effects of such amplifiers at different back-off levels. Accordingly, the HPA introduces a significant level of distortion (e.g., nonlinear interference) resulting in significant nonlinear ISI in the transmitted signal 225. The amplified signal output from the HPA is then fed through an output multiplexer (OMUX) within the downlink transponder 217. The OMUX filter is applied to the amplified signal to limit the interference to adjacent transponders. As with the IMUX, however, the OMUX also produces amplitude distortion and group delay and the group delay again causes linear ISI. FIGS. 6A and 6B illustrate example amplitude and group delay responses of a typical output multiplexer (OMUX), in accordance with example embodiments of the present invention.

The receivers 203 located within the downlink cell 230, that is serviced by the downlink beam or channel 227, all receive the same transmit signal 225. Each receiver thus must first demultiplex and filter the received signal to determine or extract for further processing only the carrier of the source signal or uplink channel that is directed to the particular terminal. In a further embodiment, in the case of a multi-channel receiver, as would be recognized, the receiver may determine and process multiple carrier frequency signals of multiple uplink channels directed to the particular terminal. For simplicity, however, the following description addresses example embodiments encompassing a single-channel receiver. Accordingly, for example, the receiver 203a will first process the received transmission signal 225 to isolate the carrier phase and frequency of the uplink signal 223a. In that regard, the receiver 203a includes the receiver section 231a. In one embodiment, the receiver section may comprise a bank of receiver mixers to frequency/phase-translate each carrier of the received signal 225, where the translation may be expressed as $\exp(-j(2\pi f_1 t + \theta_1))/\sqrt{M_c}$ for the signal 223a, and generally as $\exp(-j(2\pi f_m t + \theta_m))/\sqrt{M_c}$ for the $M^{th}$ signal 223. The signal then passes through the receive filter bank 232a, and through the processing of the receiver section 231a and the filter bank 232a, the receiver 203a extracts the carrier signal 223a, effectively tuning to the carrier frequency and phase of the uplink signal directed to the particular receiver. In one embodiment, the input-output relationship of the receive filter bank 232 of the $m^{th}$ receiver 201 may be expressed as:

$$x_m(t) = \int_{-\infty}^{\infty} r(t) \sqrt{M_c} \exp(-j(2\pi f_m t + \theta_m)) P_{m,R}(t-\lambda) d\lambda \quad (5)$$

where m=1, ... $M_c$, and $\lambda$ is an integration variable.

The filter bank 232a (e.g., $P_{m,R}(t)$) models the cascade of the matched filter and the on-board output multiplexing (OMUX) filter of the satellite transponder. The outputs of the receive filter bank are then sampled at the FTN symbol rate of the data source 205a to allow for fractionally-spaced equalization. An IMUX/OMUX equalizer 233a (e.g., a fractionally-spaced equalizer for IMUX/OMUX equalization) is then employed to compensate for the linear distortion resulting from the IMUX/OMUX filters of the satellite transponder 217. In other words, the IMUX/OMUX filter compensates for the linear distortion or ISI produced by the IMUX and OMUX filters of the satellite transponder 217, while passing the non-linear interference of the HPA and the linear interference of the FTN rates for compensation by the Turbo Volterra Module 235a. According to one embodiment, based on the known characteristics of the IMUX and OMUX filters of the satellite transponder, the IMUX/OMUX equalizer 233 can be configured to train for the appropriate compensation. For example, during a non-operational training period, a sequence of known symbols can be transmitted over the respective satellite channel, and the IMUX/OMUX equalizer can train for the appropriate compensation for the linear interference reflected by the received signals. Further, as the characteristics of the IMUX and OMUX filters aboard the satellite may change with temperature or over time, the IMUX/OMUX equalizer can periodically retrain to update the compensation based on changing operating conditions or the passage of a particular length of time (e.g., taking into account the degree of change over time of such onboard filters). According to a further embodiment, based on the known characteristics, the IMUX/OMUX equalizer can apply compensation based on an inversion of the known group delay of the IMUX and OMUX filters. Then, at the output of the IMUX/OMUX equalizer 233a, the signal $y_m(n \cdot \tau T_s)$ is generated by sampling the output of the IMUX/OMUX equalizer at the transmission symbol rate of $1/\tau$. For example, because the extracted version of the received carrier signal 223a reflects a sequence of source symbols, each mapped to a corresponding or respective constellation point, the signal is sampled in synchronization with the sample rate of the source symbols as transmitted (e.g., at the FTN rate) to obtain a received form or representation of each of the respective transmitted signal constellation points.

Figure 7A:
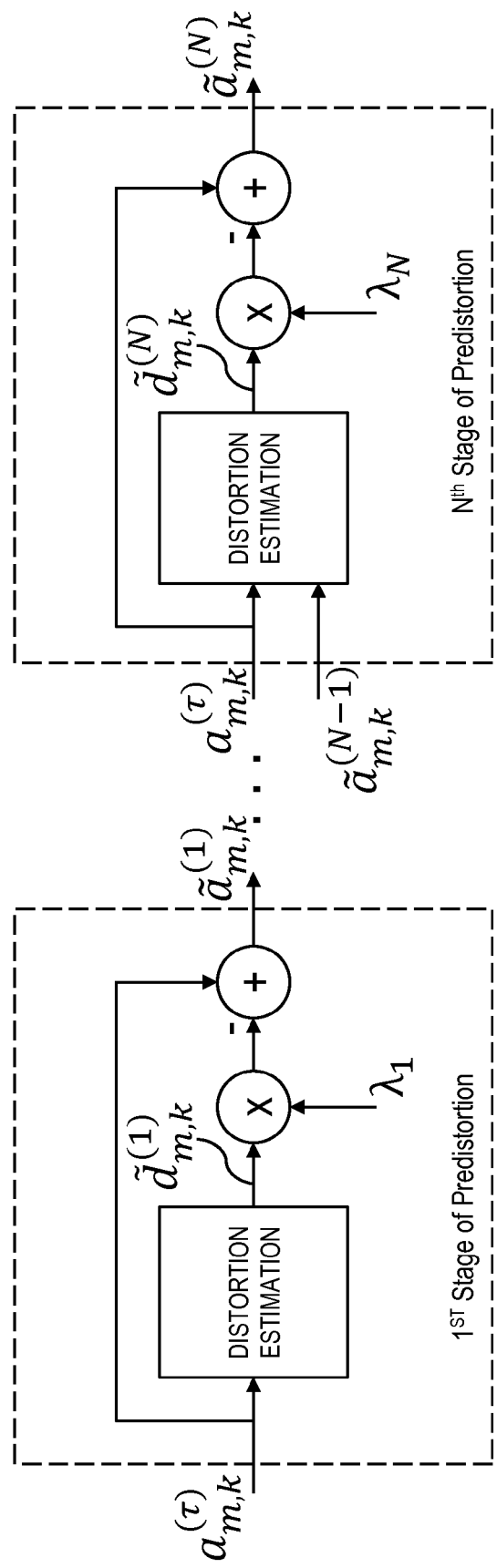
FIG. 7A illustrates a block diagram of the Multi-Stage Pre-distorter of the transmitters of FIG. 2, in accordance with example embodiments of the present invention.
Figure 7B:
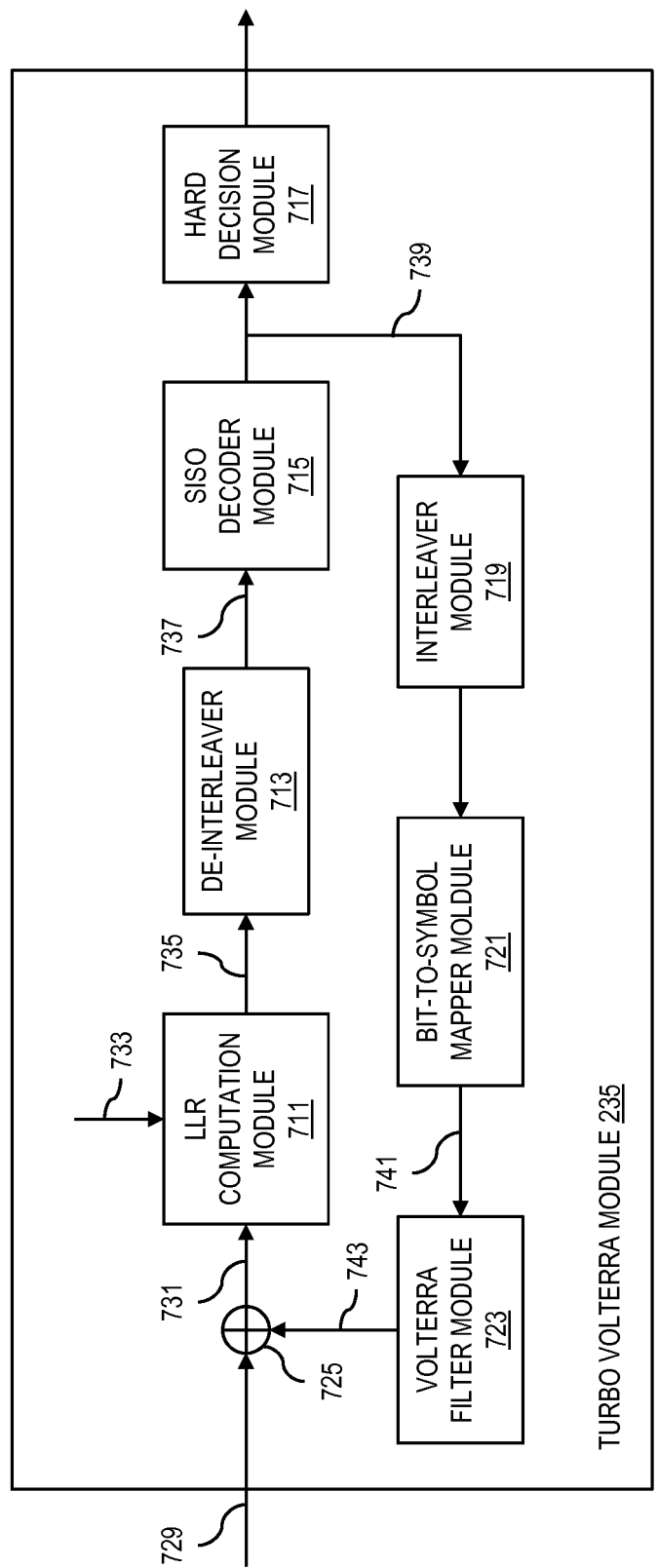
FIG. 7B illustrates a block diagram of the Turbo Volterra Module of the receivers of FIG. 2, in accordance with example embodiments of the present invention.

According to example embodiments (as depicted in FIG. 2), each transmitter employs a multi-stage pre-distorter 210. FIG. 7A illustrates a block diagram of the Multi-Stage Pre-distorter 210 of the transmitters of FIG. 2, in accordance with example embodiments of the present invention. The multi-stage pre-distorter improves performance in the presence of nonlinearity by pre-compensating at the transmit side for the associated distortion. In accordance with one embodiment, this is done by modifying the input signal constellation $\{a_{m,k}; m=1, \ldots, M_c\}$ so as to get less distortion at the receiver. By way of example, the distortion is estimated as the distortion that would result from passing a block of symbols through the cascade of the nonlinearity and the filters applied before and/or after the pre-distorter. In other words, the multistage pre-distorter estimates the distortion as an estimation or simulation of the distortion that would result from passing the encoded source symbols (e.g., the source symbols of the data source 205a) through one or more of the respective modulator 209a, the respective filter 211a, the downlink transponder of the satellite 217, and the respective filter 232a of the receiver. A factor of the respective distortion estimate is then subtracted from each of the FTN-distorted symbols before transmission. More specifically, the modified symbol is expressed as:

$$\tilde{a}_{m,k}^{(1)} = a_{m,k}^{(\tau)} - \lambda_1 \cdot d_{m,k}^{(1)}$$

where $a_{m,k}^{(\tau)}$ is the FTN-distorted symbol, $d_{m,k}^{(1)}$ is the estimate of distortion on the first stage and $\lambda_1$ is a scale factor.

To progressively improve performance, the pre-distortion method may be applied repeatedly (e.g., in a multi-stage fashion). For example, the distortion estimate is determined as the distortion that would result from passing a block of symbols (as distorted from the previous stage) through the respective cascade of the nonlinearity and the filters applied before and/or after the pre-distorter to generate an improved distortion estimate. A factor of the improved distortion estimate is then subtracted from the current block of FTN-distorted symbols before transmission. More specifically, the modified symbol at the s-stage is:

$$\tilde{a}_{m,k}^{(s)} = a_{m,k}^{(\tau)} - \lambda_s \cdot d_{m,k}^{(s)}$$

where $a_{m,k}^{(\tau)}$ is the FTN-distorted symbol, $d_{m,k}^{(s)}$ is the estimate of distortion on the s-stage, obtained by processing the symbols from (s–1)-stage pre-distortion, and $\lambda_s$ is a scale factor. The number of stages of pre-distortion is determined based on the quality of performance and the desired spectral shape of the transmitted signal.

According to further example embodiments (as depicted in FIG. 2), each receiver 203 employs a Turbo Volterra Module 235 to mitigate the impact of the FTN-induced linear ISI as well as the HPA-induced nonlinear distortion, where soft-information is exchanged between the FEC decoder and a Volterra filter within the Turbo Volterra Module. FIG. 7 illustrates a block diagram of the Turbo Volterra Module of the receivers 203 of FIG. 2, in accordance with example embodiments of the present invention. The Turbo Volterra Module 235 comprises a log-likelihood ratio (LLR) computation module 711, a de-interleaver module 713, a soft-in/soft-out (SISO) decoder module 715, a hard decision module 717, an interleaver module 719, a bit-to-symbol mapper module 721, a Volterra filter module 723, and a subtractor module 725.

The Turbo Volterra Module 235 is configured to reconstruct both the distortion caused by the HPA of the downlink transponder 217 (which is essentially nonlinear) and the linear ISI due to FTN signaling rate. According to example embodiments, the LLR computation module 711 converts the input signal 731 into an updated set of soft information 735, to match the distortion exhibited by the received signals and thereby facilitate improved performance of the decoder module 715. By way of example, using LLRs 733 ($L_a^{(E)}(c_{m,n'})$) from the previous decoding iteration, the LLR computation module converts the input signal into extrinsic LLRs 735 ($L_e^{(E)}(c_{m,n'})$) regarding the interleaved code bits. The signal conversion by the LLR computation module is performed through a predetermined number of inner iterations. The updated soft information 735 is then de-interleaved and provided as LLRs 737 for the next decoding iteration. In that regard, because the actual transmitted symbols are effectively unknown, the SISO decoder module 715 decodes the LLRs 737 to determine soft estimates of the transmitted symbols. The soft estimates are provided by the decoder in the form of soft information LLRs 739 ($L_a^{(D)}(c_{m,n'})$). The soft information LLRs 739 must then be passed through an estimation or model of the channel (provided by the interleaver module 719, the bit-to-symbol mapper module 721 and the Volterra filter module 723). Accordingly, the soft information LLRs 739 are interleaved by the interleaver module 719 and bit-to-symbol mapped via the bit-to-symbol mapper module 721, and are then provided to the Volterra filter module 723 as a set of LLRs 741 ($L_a^{(E)}(a_{m,n})$). Based on the soft information LLRs 739, the Volterra filter module thereby estimates the nonlinear interference exhibited by the received signal. Moreover, because the Volterra representation is sparse and the significant terms are few, the representation can be truncated (insignificant terms can be dropped) without a significant degradation in performance.

The interference estimate of the Volterra filter module is then subtracted from the received signal to generate an improved version of the received signal (an improved estimate of the transmitted signal based on the received signal minus the estimated nonlinear interference) for a next iteration. With each iteration, the estimate of the nonlinear interference is improved, which in turn improves the estimate of the transmitted signal (e.g., based on the received signal minus the improved estimate of the nonlinear interference). The decoder module 715 may comprise any form of SISO LDPC decoder configured to generate the soft information LLRs for feedback to a Volterra filter in such an iterative manner to provide improved estimates for compensation of the interference effects manifested by the received signal.

More specifically, during the first iteration, in the absence of the soft information LLRs 739 provided by the FEC decoder from prior iterations, the estimate signal 731 ($\tilde{y}(n \cdot \tau T_s)$) input to the LLR computation module 711 is considered as being equal to the sampled signal 729 ($y(n \cdot \tau T_s)$) input to the Turbo Volterra Module 235. The LLR computation module 711 converts the input signal 731 into the soft information 735. The resulting soft information 735 is then de-interleaved and provided as the LLRs 737, to be used by the SISO decoder module 715. The SISO decoder module 715 decodes the updated soft information 737 to determine the estimates of the transmitted symbols (in the form of the soft information LLRs 739), which are provided as feedback to compensate for the nonlinear interference (e.g., the nonlinear distortion resulting from the HPA of the satellite transponder and the linear interference or ISI resulting from the FTN transmission symbol rate) in the input signal, thereby providing an improved signal 731 ($\tilde{y}(n \cdot \tau T_s)$) for the next iteration. The soft information LLRs 739 are interleaved and bit-to-symbol mapped, and are then provided to the Volterra filter module as the set of LLRs 741. The Volterra filter module 723 computes the expectation $E\{\underline{a}_{NL}^{(3)}(n)|L_a^{(E)}\}$ is as follows:

$$E\{a_{NL}^{(3)}(n) | L_a^{(E)}\} = \sum_{i=n-(L-1)/2}^{n+(L-1)/2} E\left\{a_{m,i}^{v_{m,i}}\left(a_{m,i}^{v_{m,i}^*}\right)^* \Big| L_a^{(E)}\right\} \qquad (6)$$

The parameters $v_{m,i}$ and $v^*_{m,i}$ arise from the various $3^{rd}$-order symbol combinations. As an example, from equation (16), it is apparent that when $i=n-(L-1)/2$, $v_{m,i}=2$ and $v^*_{m,i}=1$. The individual terms in the product shown above are then computed as:

$$E\left\{a_{m,i}^{v_{m,i}}\left(a_{m,i}^{v_{m,i}^*}\right)^* \Big| L_a^{(E)}\right\} = \sum_{l=1}^{M} a_l^{v_{m,i}} \left(a_l^{v_{m,i}^*}\right)^* \cdot P\{a_l = a_l | L_a^{(E)}\} \qquad (7)$$

where the conditional symbol probability is formed using the soft information LLRs 741 ($L_a^{(E)}(a_{m,n})$). Compensation for the distortion is accomplished by subtracting the interference estimate 743 (provided by the Volterra filter module 723) from the input signal 729 ($y(n \cdot \tau T_s)$), to obtain the estimate signal 731 ($\tilde{y}(n \cdot \tau T_s)$), such that:

$$\tilde{y}(n \cdot \tau T_s) = y(n \cdot \tau T_s) - [\underline{h}(n) \cdot E\{\underline{a}_{NL}^{(3)}(n)|L_a^{(E)}\} - E\{\rho^{centroid}(a_{m,n}|L_a^{(E)})\}] \qquad (8)$$

where $\underline{h}(n)$ is the set of coefficients of the Volterra filter (chosen to model the HPA and FTN induced distortion), and $\rho^{centroid}(a_{m,n})$ is the centroid associated with the symbol $a_{m,n}$ of the samples at the input of the LLR computation module 711.

Then, for the next iteration, the LLR computation module 711 utilizes the improved signal 731 ($\tilde{y}(n \cdot \tau T_s)$) for conversion into the soft information 735. As with the prior iteration, the resulting soft information 735 is de-interleaved and provided as the LLRs 737, to be used by the SISO decoder module 715. The SISO decoder module 715 decodes the updated soft information 737 to determine improved estimates of the transmitted symbols (in the form of the soft information LLRs 739), which are provided as feedback to for improved compensation for the nonlinear interference in the input signal (based on the results of the prior iteration), thereby providing a further improved signal 731 ($\tilde{y}(n \cdot \tau T_s)$) for the next iteration. The soft information LLRs 739 are interleaved and bit-to-symbol mapped, and are then provided to the Volterra filter module as a new set of LLRs 741. The Volterra filter module 723 computes a new expectation or estimate, and improved distortion compensation is accomplished by subtracting the improved interference estimate 743 (resulting from this new iteration) from the input signal 729.

Accordingly, the operation of the Turbo Volterra Module 235 is based on a number of inner iterations of the LLR computation module 711 (e.g., for each iteration of the feedback loop (signal 739→signal 743), and a number of outer iterations of the feedback loop. The number of inner iterations for the LLR computation module and the number of outer iterations for the feedback loop are predetermined numbers based on a tradeoff between system complexity and the desired level of performance. The numbers for the inner and outer iterations are predetermined values, which can be obtained through system simulations. As the iterations are increased, the increase in performance reflected by the simulation results will be outweighed by the added complexity of the interference compensation process—the increase in complexity reaches a point of diminishing returns.

According to an example embodiment, the Volterra filter module 723 is configured to operate in the following manner. For the $m^{th}$ carrier, $\underline{h}_m(n)$ can be defined as:

$$\underline{h}_m(n) \triangleq \begin{bmatrix} \underline{h}_m^{(1)}(n; L') \\ \underline{h}_m^{(3)}(n; L) \end{bmatrix} \quad (9)$$

where, $$\underline{h}_m^{(1)}(n; L') \triangleq [\underline{\eta}^{(1)}(n; L')] \quad (10)$$

and $$\underline{h}_m^{(3)}(n; L') \triangleq [\underline{\eta}^{(3)}(n; L')] \quad (11)$$

The vectors $\underline{h}_m^{(1)}(n; L')$ and $\underline{h}_m^{(3)}(n; L)$ are in turn composed of vector $\underline{\eta}^{(1)}(n; L')$ and $\underline{\eta}^{(3)}(n; L)$, which incorporate the memory of the $1^{st}$-order interference of size L' symbols, and the memory of the $3^{rd}$-order interference, of size L symbols, such that:

$$\underline{\eta}^{(1)}(n; L') = \gamma^{(1)} \cdot \begin{bmatrix} h_m^{(1)}\left(\left(\frac{L'-1}{2}\right)T_s\right) \\ h_m^{(1)}\left(\left(\frac{L'-1}{2}-1\right)T_s\right) \\ \vdots \\ h_m^{(1)}\left(\left(-\frac{L'-1}{2}\right)T_s\right) \end{bmatrix} \quad (12)$$

and the first-order Volterra kernel is:

$$h_m^{(1)}(t) = \int_{-\infty}^{\infty} p_{m,T}(t-\tau) p_{m,R}(\tau) d\tau \quad (13)$$

Additionally, $$\underline{\eta}^{(3)}(n; L') = \gamma^{(3)} \cdot \begin{bmatrix} h_m^{(3)}\left(\left(\frac{L-1}{2}\right)T_s, \left(\frac{L-1}{2}\right)T_s, \left(\frac{L-1}{2}\right)T_s\right) \\ h_m^{(3)}\left(\left(\frac{L-1}{2}\right)T_s, \left(\frac{L-1}{2}\right)T_s, \left(\frac{L-1}{2}-1\right)T_s\right) \\ \vdots \\ h_m^{(3)}\left(\left(-\frac{L-1}{2}\right)T_s, \left(-\frac{L-1}{2}\right)T_s, \left(-\frac{L-1}{2}\right)T_s\right) \end{bmatrix} \quad (14)$$

and the third-order Volterra kernel is:

$$h_m^{(3)}(t_1, t_2, t_3) = \int_{-\infty}^{\infty} p_{m,T}(t-\tau) p_{m,T}(t_2-\tau) p_{m,T}^*(t_3-\tau) p_{m,R}(\tau) d\tau \quad (15)$$

Accordingly, the Volterra filter comprises two components, a first order component and a third order component. The first order component of the Volterra filter handles the linear interference (e.g., the linear ISI attributable to the FTN symbol transmission rate), and the third order component handles the nonlinear interference (e.g., the nonlinear distortion attributable to the satellite transponder HPAs).

According to one example embodiment $\underline{h}_m(n)$ can be computed analytically using $\gamma$, $h_m^{(1)}(t)$, and $h_m^{(3)}(t_1, t_2, t_3)$. According to a further example embodiment, $\underline{h}_m(n)$ is instead determined using stochastic gradient-based algorithms to iteratively derive the solution without a priori knowledge of the kernels. By way of example, the corresponding vector of 1st and 3rd-order symbol combinations in $a_{NL}^{(3)}$ (of equation (8), above) are expressed as:

$$\begin{bmatrix} a_{m,n-\frac{L'-1}{2}} \\ \vdots \\ a_{m,n+\frac{L'-1}{2}} \\ a_{m,n-\frac{L-1}{2}} a_{m,n-\frac{L-1}{2}} a_{m,n-\frac{L-1}{2}}^* \\ a_{m,n-\frac{L-1}{2}} a_{m,n-\frac{L-1}{2}} a_{m,n-\frac{L-1}{2}+1}^* \\ \vdots \\ a_{m,n+\frac{L-1}{2}} a_{m,n+\frac{L-1}{2}} a_{m,n+\frac{L-1}{2}}^* \end{bmatrix} \quad (16)$$

The proposed receiver of example embodiments thereby maintains a complexity that is not exponential with the alphabet size M, which is particularly useful with FTN-induced distortion, which tends to linger over large number of symbols.

According to example embodiments, with regard to the operation of the LLR computation module 711, the module 711 may be configured to determine a plurality of likelihood metrics (LMs), which in turn are used to generate log-likelihood ratios (LLRs) to be passed to the decoder 237 for the determination of the code-bits of the respective transmitted source data symbol. According to one embodiment, for example, each LM may be based on a sample representation with respect to a one signal constellation point (with respect to the corresponding source data symbol), and a different one of a plurality of core parameters (CPs), where each CP is based on a centroid estimate with respect to a different signal cluster. According to a further embodiment, each LM may be based on the sample representation with respect to the one signal constellation point (with respect to the one corresponding source data symbol), and a different one of a plurality of variance parameters (VPs), where each VP is based on a variance estimate with respect to a different signal cluster. According to yet a further embodiment, each LM may be based on the sample representation with respect to the one signal constellation point (with respect to the one corresponding source data symbol), and a different one of a plurality of correlation parameters (CnPs), where each CnP is based on a correlation estimate with respect to a different signal cluster. Further, the LLR computation module 711 may be configured to determine the LMs based on the sample representation with respect to the one signal constellation point, along with a combination of one or more of the CPs, CnPs and VPs. Such operational methods for the LLR computation module 711 are further described in copending U.S. patent application Ser. No. 13/622,348 (filed 18 Sep. 2012). Alternatively, the LLR computation module 711 may employ other techniques for the determination of likelihood metrics (LMs) and/or log-likelihood ratios (LLRs) for facilitating improved operation of the decoder module.

The following provides a performance evaluation with respect to various example embodiments, based on an extensive Monte-Carlo simulation study. The simulation results reflect performance results based on transmitter and receiver implementations as illustrated in FIGS. 2 through 7A and 7B. The transmit and receive filters $P_{m,T}(t)$ and $P_{m,R}(t)$ being a matched pair of root-raised cosine (RRC) filters with a roll-off factor of 0.10, and the forward error correction (FEC) being LDPC encoding and decoding with an LDPC code of codeblock length 64800 bits. Further, the performance charts reflect a DVB-S2 standard system as a benchmark for illustrating the improvement in terms of spectral efficiency measured in bits/sec/Hz. The spectral efficiency may be defined as:

$$\eta = \frac{R_c \log_2 M}{\tau} \cdot \frac{R_S}{B_{OMUX}}$$

Figure 8B:
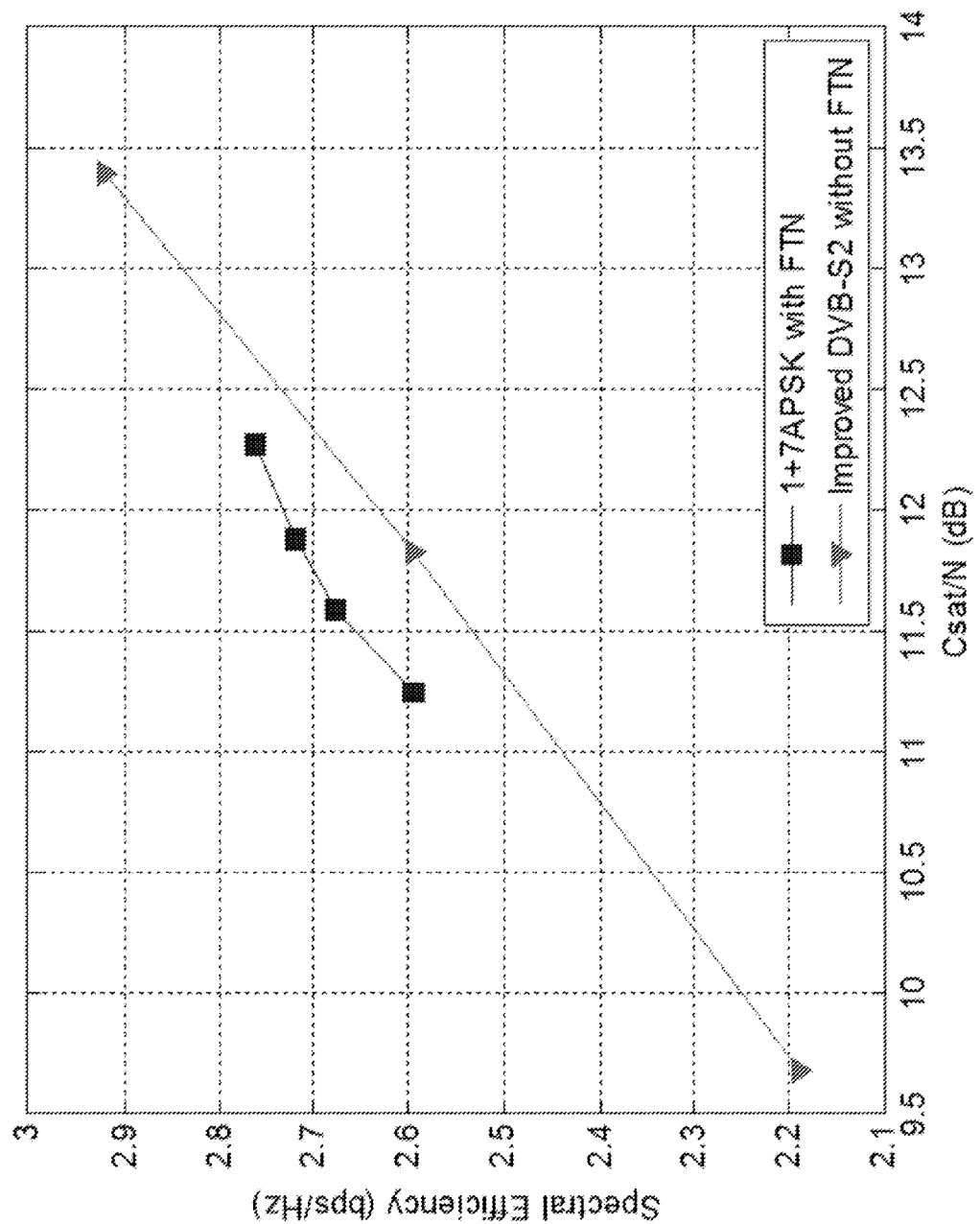
FIG. 8B illustrates spectral efficiency as a function of SNR for solutions, with and without FTN, in the presence of IMUX/OMUX filters and TWTA, in accordance with example embodiments of the present invention.

FIG. 8A illustrates bit-to-symbol labeling for a 1+7 APSK constellation, and FIG. 8B illustrates spectral efficiency as a function of SNR for solutions, with and without FTN, in the presence of IMUX/OMUX filters and TWTA, in accordance with example embodiments of the present invention. The 1+7APSK constellation of FIG. 8A comprises a bit-to-symbol labeling and constellation symbol positioning as specified in the following table (Table 1).

TABLE 1

| Bit Label | [x, y] Coordinates |
|---|---|
| 000 | [0, 0, 0.0] |
| 001 | [$\sqrt{8.0*\epsilon_s/7.0}$, 0.0] |
| 010 | [$\sqrt{8.0*\epsilon_s/7.0}$ * cos(4.0 * π/7.0), $\sqrt{8.0*\epsilon_s/7.0}$ * sin(4.0 * π/7.0)] |
| 011 | [$\sqrt{8.0*\epsilon_s/7.0}$ * cos(2.0 * π/7.0), $\sqrt{8.0*\epsilon_s/7.0}$ * sin(2.0 * π/7.0)] |
| 100 | [$\sqrt{8.0*\epsilon_s/7.0}$ * cos(12.0 * π/7.0), $\sqrt{8.0*\epsilon_s/7.0}$ * sin(12.0 * π/7.0)] |
| 101 | [$\sqrt{8.0*\epsilon_s/7.0}$ * cos(10.0 * π/7.0), $\sqrt{8.0*\epsilon_s/7.0}$ * sin(10.0 * π/7.0)] |
| 110 | [$\sqrt{8.0*\epsilon_s/7.0}$ * cos(6.0 * π/7.0), $\sqrt{8.0*\epsilon_s/7.0}$ * sin(6.0 * π/7.0)] |
| 111 | [$\sqrt{8.0*\epsilon_s/7.0}$ * cos(8.0 * π/7.0), $\sqrt{8.0*\epsilon_s/7.0}$ * sin(8.0 * π/7.0)] |

Moreover, while system performance is generally affected by the particular bit labeling and bit positioning for each constellation, the optimal labeling and bit positions specified in Table 1 are not unique in that certain specific modifications of bit labeling and bit positioning can achieve equivalent performance. One such modification exists with respect to the bit positions, whereby equivalent performance can be achieved with a 1+7APSK signal constellation as specified by Table 1, but where each of the [x, y] bit positions is rotated by a fixed rotation factor (e.g., each bit position is rotated by the same rotation factor, such as 5 degrees, 7 degrees, 12 degrees, etc.). Other modifications exist with respect to the bit labeling, whereby equivalent performance can be achieved with a 1+7APSK signal constellation as specified by Table 1, but where the bit labeling is modified by interchanging the 0's and 1's (changing each one to a zero and changing each zero to a one in each bit label) and/or by applying a uniform swapping of bit positions within each bit label (uniformly swapping one or more bit positions with one or more corresponding other bit positions in each bit label—e.g., swapping the first and third bit label positions within each bit label). Moreover, any of the foregoing specific modifications can either be applied by itself or in combination with any one or more of the other specific modifications.

In FIG. 8B, $B_{OMUX}$ is the 3 dB bandwidth OMUX filter shown in FIGS. 6A and 6B. FIG. 8B includes the achievable spectral efficiency as a function of the signal-to noise ratio (SNR), associated with a family of solutions, both with and without FTN and for which $R_S$=37 Msps and $B_{OMUX}$=38 MHz.

The curve labeled as Improved DVB-S2 without FTN illustrates the performance that can be achieved by 8PSK and 16 APSK modulations without FTN using the DVB-S2 LDPC code. An adaptive fractionally-spaced equalizer implementing the least-mean squares (LMS) algorithm performs the function of the IMUX/OMUX equalizer module shown in FIGS. 4A, 4B, 5A, 5B.

To attain a spectral efficiency 2.19 bits/sec/Hz without FTN, 8PSK modulation is employed with a code rate 3/4. Without FTN, the higher spectral efficiencies of 2.59 b/s/Hz and 2.92 b/s/Hz are obtained using 16APSK modulation with code rates 2/3 and 3/4 respectively. To further improve performance of the DVB-S2 16APSK modulation, the constellation ring-ratio has been optimized for each code rate. It is noted that the LMS equalizer, being a linear equalizer does very little to mitigate the nonlinear distortion caused by the HPA.

By offering an additional degree of freedom in the time-compression τ, FTN provides significant performance improvements over the non-FTN system, for a particular alphabet size M. The combination of multistage pre-distortion applied at the transmitter and presence of Turbo Volterra receiver allows one to successfully mitigate the distortion introduced by FTN signaling and the nonlinear HPA operating close to saturation. Hence, 1+7APSK with FTN, employing multistage pre-distortion at the transmitter and the Turbo Volterra receiver offers very substantial performance improvement over a DVB-S2 system, as shown in FIG. 8B. For instance, at 2.59b/s/Hz, a 0.6 dB improvement in SNR is observed with 1+7APSK with FTN over current DVB-S2 signaling even when a fractionally-spaced LMS equalizer is employed.

Figure 9:
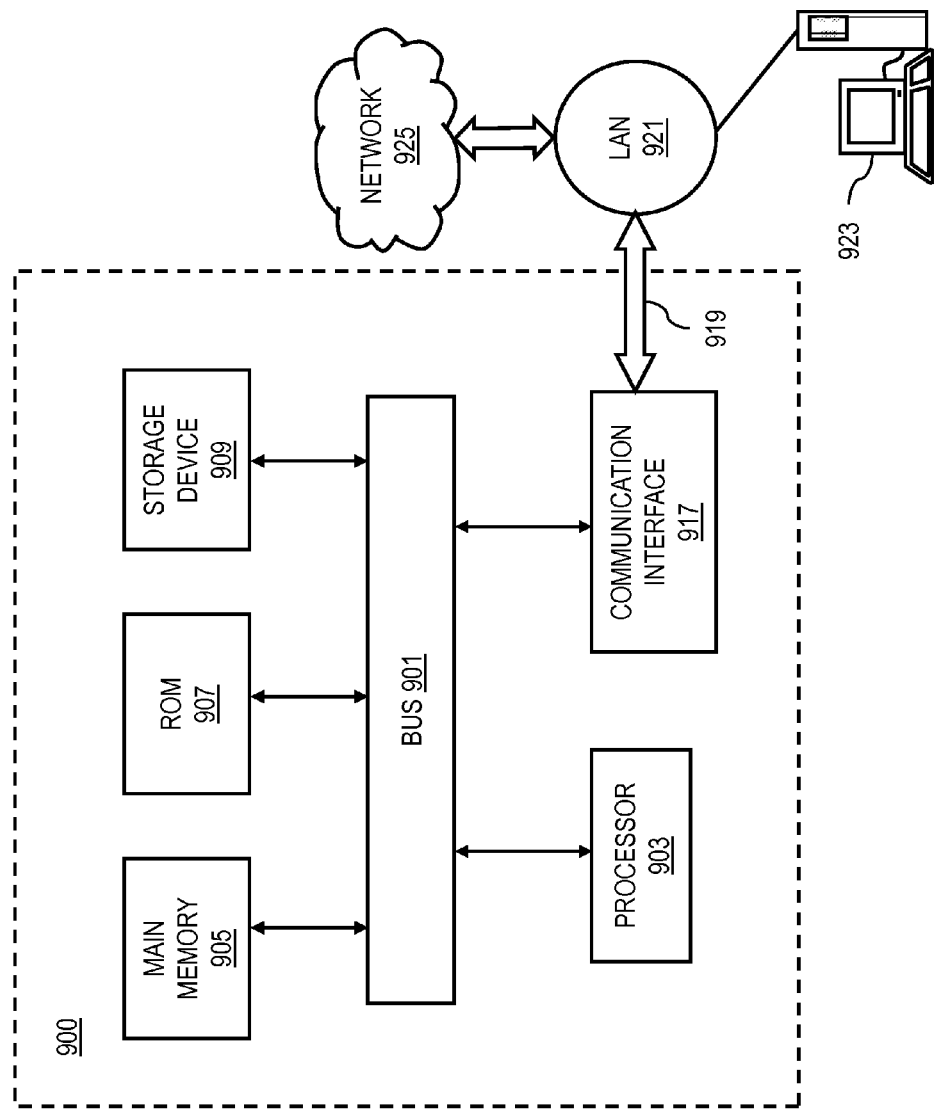
FIG. 9 illustrates a computer system upon which example embodiments according to the present invention can be implemented.

FIG. 9 illustrates a computer system upon which example embodiments according to the present invention can be implemented. The computer system 900 includes a bus 901 or other communication mechanism for communicating information, and a processor 903 coupled to the bus 901 for processing information. The computer system 900 also includes main memory 905, such as a random access memory (RAM) or other dynamic storage device, coupled to the bus 901 for storing information and instructions to be executed by the processor 903. Main memory 905 can also be used for storing temporary variables or other intermediate information during execution of instructions to be executed by the processor 903. The computer system 900 further includes a read only memory (ROM) 907 or other static storage device coupled to the bus 901 for storing static information and instructions for the processor 903. A storage device 909, such as a magnetic disk or optical disk, is additionally coupled to the bus 901 for storing information and instructions.

According to one embodiment of the invention, implementations of an interference compensation system and algorithms, in accordance with example embodiments, are provided by the computer system 900 in response to the processor 903 executing an arrangement of instructions contained in main memory 905. Such instructions can be read into main memory 905 from another computer-readable medium, such as the storage device 909. Execution of the arrangement of instructions contained in main memory 905 causes the processor 903 to perform the process steps described herein. One or more processors in a multi-processing arrangement may also be employed to execute the instructions contained in main memory 905. In alternative embodiments, hard-wired circuitry is used in place of or in combination with software instructions to implement the embodiment of the present invention. Thus, embodiments of the present invention are not limited to any specific combination of hardware circuitry and software.

The computer system 900 also includes a communication interface 917 coupled to bus 901. The communication interface 917 provides a two-way data communication coupling to a network link 919 connected to a local network 921. For example, the communication interface 917 may be a digital subscriber line (DSL) card or modem, an integrated services digital network (ISDN) card, a cable modem, or a telephone modem to provide a data communication connection to a corresponding type of telephone line. As another example, communication interface 917 may be a local area network (LAN) card (e.g., for Ethernet™ or an Asynchronous Transfer Mode (ATM) network) to provide a data communication connection to a compatible LAN. Wireless links can also be implemented. In any such implementation, communication interface 917 sends and receives electrical, electromagnetic, or optical signals that carry digital data streams representing various types of information. Further, the communication interface 917, for example, includes peripheral interface devices, such as a Universal Serial Bus (USB) interface, a PCMCIA (Personal Computer Memory Card International Association) interface, etc.

The network link 919 typically provides data communication through one or more networks to other data devices. For example, the network link 919 provides a connection through local network 921 to a host computer 923, which has connectivity to a network 925 (e.g., a wide area network (WAN) or the global packet data communication network now commonly referred to as the "Internet") or to data equipment operated by service provider. The local network 921 and network 925 both use electrical, electromagnetic, or optical signals to convey information and instructions. The signals through the various networks and the signals on network link 919 and through communication interface 917, which communicate digital data with computer system 900, are example forms of carrier waves bearing the information and instructions.

The computer system 900 sends messages and receives data, including program code, through the network(s), network link 919, and communication interface 917. In the Internet example, a server (not shown) might transmit requested code belonging to an application program for implementing an embodiment of the present invention through the network 925, local network 921 and communication interface 917. The processor 903 executes the transmitted code while being received and/or store the code in storage device 239, or other non-volatile storage for later execution. In this manner, computer system 900 obtains application code in the form of a carrier wave.

The term "computer-readable medium" as used herein refers to any medium that participates in providing instructions to the processor 903 for execution. Such a medium may take many forms, including but not limited to non-volatile media, volatile media, and transmission media. Non-volatile media include, for example, optical or magnetic disks, such as storage device 909. Volatile media may include dynamic memory, such as main memory 905. Transmission media may include coaxial cables, copper wire and fiber optics, including the wires that comprise bus 901. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD ROM, CDRW, DVD, any other optical medium, punch cards, paper tape, optical mark sheets, any other physical medium with patterns of holes or other optically recognizable indicia, a RAM, a PROM, and EPROM, a FLASH EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Figure 10:
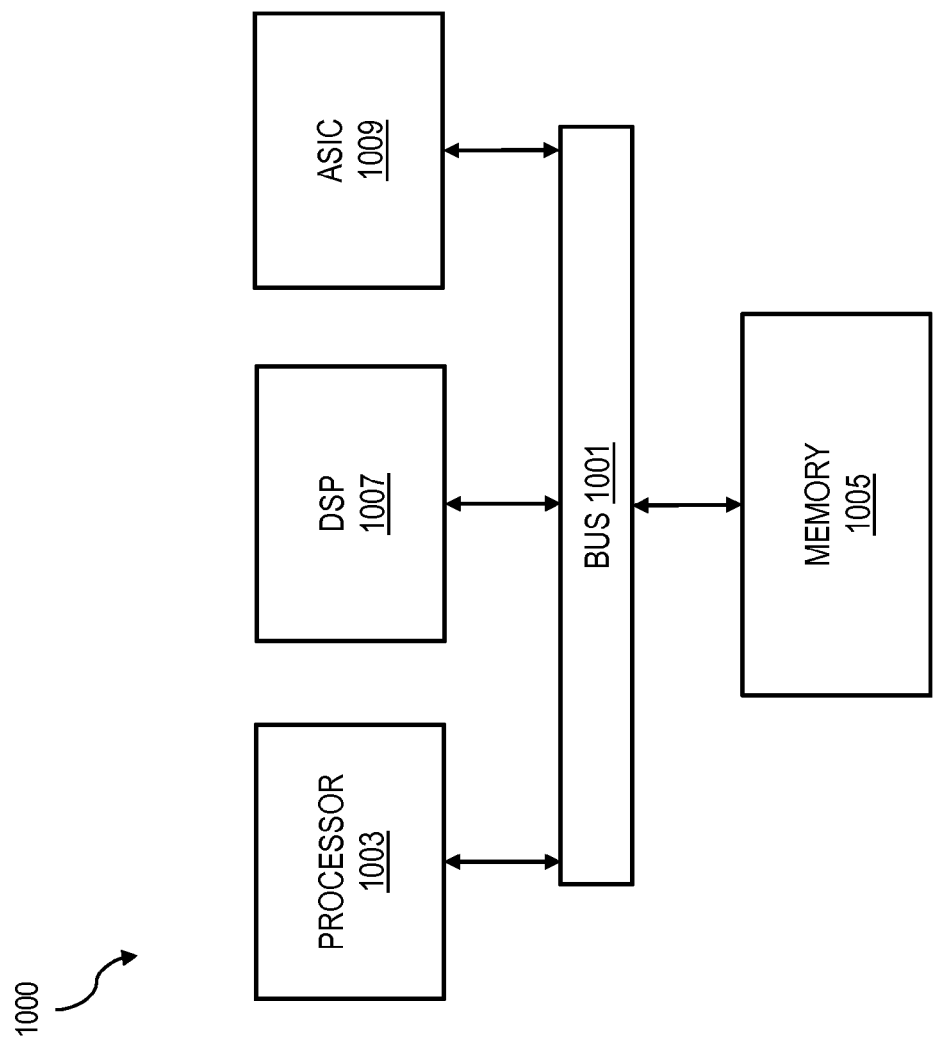
FIG. 10 is a diagram of a chip set that can be utilized in implementing an interference compensation system, according to example embodiments.

FIG. 10 illustrates a chip set 1000 in which embodiments of the invention may be implemented. Chip set 1000 includes, for instance, processor and memory components described with respect to FIG. 9 incorporated in one or more physical packages. By way of example, a physical package includes an arrangement of one or more materials, components, and/or wires on a structural assembly (e.g., a baseboard) to provide one or more characteristics such as physical strength, conservation of size, and/or limitation of electrical interaction.

In one embodiment, the chip set 1000 includes a communication mechanism such as a bus 1001 for passing information among the components of the chip set 1000. A processor 1003 has connectivity to the bus 1001 to execute instructions and process information stored in, for example, a memory 1005. The processor 1003 includes one or more processing cores with each core configured to perform independently. A multi-core processor enables multiprocessing within a single physical package. Examples of a multi-core processor include two, four, eight, or greater numbers of processing cores. Alternatively or in addition, the processor 1003 includes one or more microprocessors configured in tandem via the bus 1001 to enable independent execution of instructions, pipelining, and multithreading. The processor 1003 may also be accompanied with one or more specialized components to perform certain processing functions and tasks such as one or more digital signal processors (DSP) 1007, and/or one or more application-specific integrated circuits (ASIC) 1009. A DSP 1007 typically is configured to process real-world signals (e.g., sound) in real time independently of the processor 1003. Similarly, an ASIC 1009 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 1003 and accompanying components have connectivity to the memory 1005 via the bus 1001. The memory 1005 includes both dynamic memory (e.g., RAM) and static memory (e.g., ROM) for storing executable instructions that, when executed by the processor 1003 and/or the DSP 1007 and/or the ASIC 1009, perform the process of example embodiments as described herein. The memory 1005 also stores the data associated with or generated by the execution of the process.

While example embodiments of the present invention may provide for various implementations (e.g., including hardware, firmware and/or software components), and, unless stated otherwise, all functions are performed by a CPU or a processor executing computer executable program code stored in a non-transitory memory or computer-readable storage medium, the various components can be implemented in different configurations of hardware, firmware, software, and/or a combination thereof. Except as otherwise disclosed herein, the various components shown in outline or in block form in the figures are individually well known and their internal construction and operation are not critical either to the making or using of this invention or to a description of the best mode thereof.

In the preceding specification, various embodiments have been described with reference to the accompanying drawings. It will, however, be evident that various modifications may be made thereto, and additional embodiments may be implemented, without departing from the broader scope of the invention as set forth in the claims that follow. The specification and drawings are accordingly to be regarded in an illustrative rather than restrictive sense.

What is claimed is:

1. An apparatus comprising:
    a signal input configured to receive a source digital data signal comprising a plurality of source digital data symbols;
    an encoder configured to receive the source digital data signal and to encode the source digital data signal to generate a corresponding encoded digital signal;
    a modulator configured to receive the encoded digital signal and to modulate the encoded digital signal for transmission over a satellite communications channel by mapping each source digital data symbol to a respective signal constellation point of an applied signal constellation to generate a modulated signal;
    a pre-distorter configured to receive the modulated signal and to pre-distort the modulated signal based on a distortion estimate to generate a pre-distorted signal;
    a filter configured to receive the pre-distorted signal and to filter the pre-distorted signal to generate a filtered signal; and
    a transmitter configured to receive the filtered signal and to frequency translate and amplify the filtered signal to generate a transmission signal for transmission via an uplink channel to a satellite; and
    wherein, to increase system throughput, the source digital data signal is processed through the apparatus and the resulting transmission signal is generated based on a transmission symbol rate that is configured as a faster than Nyquist (FTN) symbol rate $1/\tau$ that is greater than one, and
    wherein the distortion estimate is configured to pre-compensate at least for distortion that would result from the transmission of the modulated signal via the uplink channel to the satellite.

2. The apparatus of claim 1, wherein, for pre-distorting the modulated signal, the pre-distorter is further configured to pre-compensate for distortion that would result from one or more of further processing by at least one transponder of the satellite for transmission to a receiver apparatus via a satellite downlink channel and further processing by the receiver apparatus.

3. The apparatus of claim 1, wherein, for pre-distorting the modulated signal, the pre-distorter is configured to estimate distortion that would result from passing the encoded digital signal through one or more of the filter, the transmitter, a downlink transponder of the satellite and a filter of a receiver apparatus, and to subtract a factor of the estimated distortion from each symbol of the modulated signal.

4. The apparatus of claim 3, wherein each pre-distorted symbol of the modulated signal can be expressed as $\tilde{a}_k = a_k^{(\tau)} - \lambda_1 \cdot d_k$, where $1/\tau$ is the FTN symbol rate, $a_k^{(\tau)}$ is the $k^{th}$ symbol, $d_k$ is the estimate of the distortion and $\lambda$ is a scale factor.

5. The apparatus of claim 1, wherein the pre-distorter comprises a multi-stage pre-distorter, and the pre-distorter is configured to apply the pre-distortion repeatedly in a multi-stage pre-distortion process.

6. The apparatus of claim 5, wherein, for pre-distorting the modulated signal via the multi-stage pre-distortion process, the pre-distorter is configured to:
    in a first stage, estimate a first-stage distortion that would result from passing the encoded digital signal through one or more of the filter, the transmitter, a downlink transponder of the satellite and a filter of a receiver apparatus, and subtract a factor of the estimated distortion from each symbol of the modulated signal to generate a first-stage pre-distorted signal; and
    in a second stage, estimate a second-stage distortion that would result from passing the first-stage pre-distorted signal through one or more of the filter, the transmitter, the downlink transponder of the satellite and the filter of the receiver apparatus, and subtract a factor of the estimated second-stage distortion from each symbol of the first-stage pre-distorted signal to generate a second-stage pre-distorted signal.

7. The apparatus of claim 6, wherein the multi-stage pre-distortion process is performed for a predetermined number of stages, wherein the estimation of the distortion for a current stage is based on a pre-distorted signal of the previous stage, and a factor of the estimated distortion for the current stage is subtracted from each symbol of the pre-distorted signal of the previous stage to generate a current-stage pre-distorted signal.

8. The apparatus of claim 7, wherein each pre-distorted symbol of the modulated signal can be expressed as $\tilde{a}_k^{(s)} = a_k^{(\tau)} - \lambda_s \cdot d_k^{(s)}$, where $1/\tau$ is the FTN symbol rate, $a_k^{(\tau)}$ is the $k^{th}$ symbol as pre-distorted via the previous stage of the multi-stage pre-distortion process, $d_k^{(s)}$ is the estimate of the distortion for the current stage of the multi-stage pre-distortion process and $\lambda_s$ is a scale factor for the current stage of the multi-stage pre-distortion process.

9. The apparatus of claim 7, wherein the predetermined number of stages is based on a desired quality of performance and a desired spectral shape of the transmitted signal.

10. A method comprising:
    receiving a source digital data signal comprising a plurality of source digital data symbols;

encoding the source digital data signal to generate a corresponding encoded digital signal;

modulating the encoded digital signal for transmission over a wireless communications channel by mapping each source digital data symbol to a respective signal constellation point of an applied signal constellation to generate a modulated signal;

pre-distorting the modulated signal based on a distortion estimate to generate a pre-distorted signal;

filtering the pre-distorted signal to generate a filtered signal; and frequency translating and amplifying the filtered signal to generate a transmission signal for transmission via an uplink channel to a satellite; and wherein, to increase system throughput, the source digital data signal is processed to generate the transmission signal based on a transmission symbol rate that is configured as a faster than Nyquist (FTN) symbol rate $1/\tau$ that is greater than one, and wherein the distortion estimate is configured to pre-compensate at least for distortion that would result from the transmission of the modulated signal via the uplink channel to the satellite.

11. The method of claim 10, wherein, the pre-distortion of the modulated signal further comprises pre-compensating for distortion that would result from one or more of further processing by at least one transponder of the satellite for transmission to a receiver device via a satellite downlink channel and further processing by the receiver device.

12. The method of claim 10, wherein, the pre-distortion of the modulated signal comprises estimating distortion that would result from passing the encoded digital signal through one or more of the filtering, the frequency translation and amplification, a downlink transponder of the satellite and a filtering by a receiver apparatus, and subtracting a factor of the estimated distortion from each symbol of the modulated signal.

13. The method of claim 12, wherein each pre-distorted symbol of the modulated signal can be expressed as $\tilde{a}_k = a_k^{(\tau)} - \lambda_1 \cdot d_k$, where $1/\tau$ is the FTN symbol rate, $a_k^{(\tau)}$ is the $k^{th}$ symbol, $d_k$ is the estimate of the distortion and $\lambda$ is a scale factor.

14. The method of claim 10, wherein the pre-distortion is performed repeatedly in a multi-stage pre-distortion process.

15. The method of claim 14, wherein the multi-stage pre-distortion process comprises:

in a first stage, estimating a first-stage distortion that would result from passing the encoded digital signal through one or more of the filtering, the frequency translation and amplification, a downlink transponder of the satellite and a filtering by a receiver apparatus, and subtracting a factor of the estimated distortion from each symbol of the modulated signal to generate a first-stage pre-distorted signal; and in a second stage, estimating a second-stage distortion that would result from passing the first-stage pre-distorted signal through one or more of the filtering, the frequency translation and amplification, a downlink transponder of the satellite and a filtering by a receiver apparatus, and subtracting a factor of the estimated second-stage distortion from each symbol of the first-stage pre-distorted signal to generate a second-stage pre-distorted signal.

16. The method of claim 15, wherein the multi-stage pre-distortion process is performed for a predetermined number of stages, wherein the estimation of the distortion for a current stage is based on a pre-distorted signal of the previous stage, and a factor of the estimated distortion for the current stage is subtracted from each symbol of the pre-distorted signal of the previous stage to generate a current-stage pre-distorted signal.

17. The method of claim 16, wherein each pre-distorted symbol of the modulated signal can be expressed as $\tilde{a}_k^{(s)} = a_k^{(\tau)} - \lambda_s \cdot d_k^{(s)}$, where $1/\tau$ is the FTN symbol rate, $a_k^{(\tau)}$ is the $k^{th}$ symbol as pre-distorted via the previous stage of the multi-stage pre-distortion process, $d_k^{(s)}$ is the estimate of the distortion for the current stage of the multi-stage pre-distortion process and $\lambda_s$ is a scale factor for the current stage of the multi-stage pre-distortion process.

18. The apparatus of claim 16, wherein the predetermined number of stages is based on a desired quality of performance and a desired spectral shape of the transmitted signal.

19. A system comprising:

a transmitter device, wherein the transmitter device comprises, a signal input configured to receive a source digital data signal comprising a plurality of source digital data symbols, an encoder configured to receive the source digital data signal and to encode the source signal to generate a corresponding encoded digital signal, a modulator configured to receive the encoded digital signal and to modulate the encoded digital signal for transmission over a wireless communications channel by mapping each source digital data symbol to a respective signal constellation point of an applied signal constellation to generate a modulated signal, a pre-distorter configured to receive the modulated signal and to pre-distort the modulated signal based on a distortion estimate to generate a pre-distorted signal;

a filter configured to receive the pre-distorted signal and to filter the pre-distorted signal to generate a filtered signal, and a transmitter configured to receive the filtered signal and to frequency translate and amplify the filtered signal to generate a transmission signal for transmission via an uplink channel to a satellite, wherein, to increase system throughput, the source digital data signal is processed through the apparatus and the resulting transmission signal is generated based on a transmission symbol rate that is configured as a faster than Nyquist (FTN) symbol rate $1/\tau$ that is greater than one, and wherein the distortion estimate is configured to pre-compensate at least for distortion that would result from the transmission of the modulated signal via the uplink channel to the satellite; and a receiver device configured to receive a signal transmitted from the satellite via a downlink channel, wherein the received signal reflects the transmission signal as received by the satellite, wherein the received signal includes one or more of linear intersymbol interference (ISI) effects induced based on the faster-than-Nyquist (FTN) symbol rate, and non-linear interference effects induced based on high-power amplification by the satellite for the transmission via the downlink channel, wherein the receiver is configured to process the received signal based on a plurality of decoding iterations, and wherein the receiver comprises a likelihood metric processor configured to generate a set of soft information of a current decoding iteration based on a current estimate of the source signal and a final set of soft information from a previous decoding iteration, wherein the current estimate of the source signal is based on an estimate of the linear ISI effects and the non-linear interference effects, which is based on the final set of soft information from the previous decoding iteration.

20. The system of claim 19, wherein:

for pre-distorting the modulated signal, the pre-distorter is configured to estimate distortion that would result from passing the encoded digital signal through one or more of the filter, the transmitter, a downlink transponder of the satellite and a filter of the receiver device, and to subtract a factor of the estimated distortion from each symbol of the modulated signal the pre-distorter comprises a multi-stage pre-distorter, and the pre-distorter is configured to apply the pre-distortion repeatedly in a multi-stage pre-distortion process;

the multi-stage pre-distortion process is performed for a predetermined number of stages, wherein the estimation of the distortion for a current stage is based on a pre-distorted signal of the previous stage, and a factor of the estimated distortion for the current stage is subtracted from each symbol of the pre-distorted signal of the previous stage to generate a current-stage pre-distorted signal; and the predetermined number of stages is based on a desired quality of performance and a desired spectral shape of the transmitted signal.

* * * * *